(12) United States Patent
Takazaki

(10) Patent No.: US 11,408,066 B2
(45) Date of Patent: Aug. 9, 2022

(54) DECORATIVE MEMBER AND METHOD FOR PRODUCING THE SAME

(71) Applicant: CITIZEN WATCH CO., LTD., Tokyo (JP)

(72) Inventor: Kotaro Takazaki, Sayama (JP)

(73) Assignee: CITIZEN WATCH CO., LTD., Tokyo (JP)

( * ) Notice: Subject to any disclaimer, the term of this patent is extended or adjusted under 35 U.S.C. 154(b) by 980 days.

(21) Appl. No.: 16/087,324

(22) PCT Filed: Mar. 27, 2017

(86) PCT No.: PCT/JP2017/012245
§ 371 (c)(1),
(2) Date: Sep. 21, 2018

(87) PCT Pub. No.: WO2017/170324
PCT Pub. Date: Oct. 5, 2017

(65) Prior Publication Data
US 2021/0222285 A1    Jul. 22, 2021

(30) Foreign Application Priority Data
Mar. 31, 2016   (JP) .............................. JP2016-072160

(51) Int. Cl.
*B32B 15/04* (2006.01)
*C23C 14/18* (2006.01)
(Continued)

(52) U.S. Cl.
CPC .......... *C23C 14/185* (2013.01); *A44C 27/003* (2013.01); *C22C 5/02* (2013.01);
(Continued)

(58) Field of Classification Search
None
See application file for complete search history.

(56) References Cited

U.S. PATENT DOCUMENTS 4,791,017 A * 12/1988 Hofmann ............. A44C 27/006
428/216
5,985,469 A * 11/1999 Kurakata ................ C23C 28/04
428/627
(Continued)

FOREIGN PATENT DOCUMENTS

CN   104204277 A   12/2014
CN   105313398 A    2/2016
(Continued)

OTHER PUBLICATIONS

Communication dated Jan. 6, 2020 from the State Intellectual Property Office of the P.R.C. in application No. 201780019524.7.
(Continued)

*Primary Examiner* — Seth Dumbris
(74) *Attorney, Agent, or Firm* — Sughrue Mion, PLLC

(57) ABSTRACT

To provide a decorative member having a cherry blossom pink color.
A cherry blossom pink decorative member of the present invention includes a base and a decorative coating formed on the base, wherein the decorative coating is formed by layering an undercoat layer and a finishing layer from the base side, the undercoat layer is a carbonitride layer composed of a carbonitride of a metal containing Ti and at least one selected from Nb and Ta, and the finishing layer is a Au alloy layer composed of an alloy containing Au, a metal having a silver color, and Cu.

22 Claims, 8 Drawing Sheets

(51) Int. Cl.
*A44C 27/00* (2006.01)
*C22C 5/02* (2006.01)
*C23C 14/00* (2006.01)
*C23C 14/06* (2006.01)
*C23C 14/34* (2006.01)
*C23C 14/58* (2006.01)

(52) U.S. Cl.
CPC ...... *C23C 14/0036* (2013.01); *C23C 14/0664* (2013.01); *C23C 14/34* (2013.01); *C23C 14/5806* (2013.01); *Y10T 428/12576* (2015.01)

(56) References Cited

U.S. PATENT DOCUMENTS

| | | | |
|---|---|---|---|
| 9,469,765 B2 | 10/2016 | Takazaki | |
| 2004/0101708 A1* | 5/2004 | Chen | B32B 15/01 428/623 |
| 2010/0227156 A1 | 9/2010 | Satoh et al. | |
| 2010/0255338 A1* | 10/2010 | Hayakawa | C23C 14/0664 428/627 |
| 2011/0123815 A1 | 5/2011 | Kawakami et al. | |
| 2013/0155822 A1 | 6/2013 | Kawakami et al. | |
| 2015/0044453 A1 | 2/2015 | Takazaki | |

FOREIGN PATENT DOCUMENTS

| | | | | |
|---|---|---|---|---|
| EP | 2 135 972 A1 | 12/2009 | | |
| GB | 2 227 756 A | 8/1990 | | |
| JP | 02-254155 A | 10/1990 | | |
| JP | 04-214881 A | 8/1992 | | |
| JP | 10-245646 A | 9/1998 | | |
| JP | 2002-53917 A | 2/2002 | | |
| JP | 2005076085 A | 3/2005 | | |
| JP | 2005146304 A | * | 6/2005 | ........... C23C 28/341 |
| JP | 2009-213616 A | 9/2009 | | |
| JP | 2011-112462 A | 6/2011 | | |
| JP | 2012-35304 A | 2/2012 | | |
| WO | 2008/108181 A1 | 9/2008 | | |
| WO | 2009/038151 A1 | 3/2009 | | |
| WO | 2009/038152 A1 | 3/2009 | | |

OTHER PUBLICATIONS

Communication dated Oct. 16, 2019, issued by the European Patent Office in corresponding application No. 17774861.3.

International Search Report for PCT/JP2017/012245 dated Jun. 20, 2017 [PCT/ISA/210].

* cited by examiner

[Figure 1]
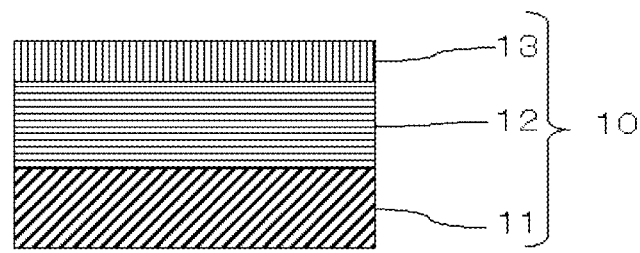
[Figure 2]
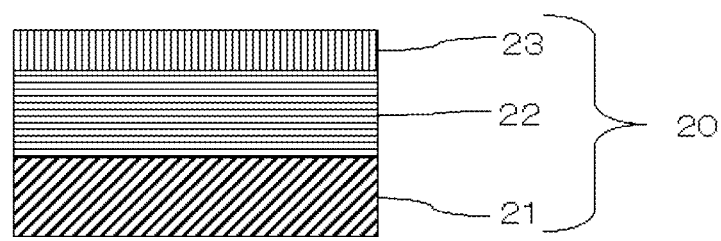
[Figure 3]
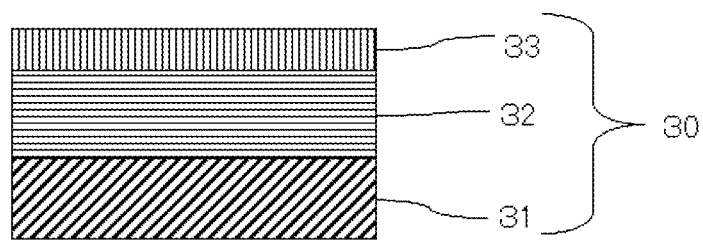
[Figure 4]
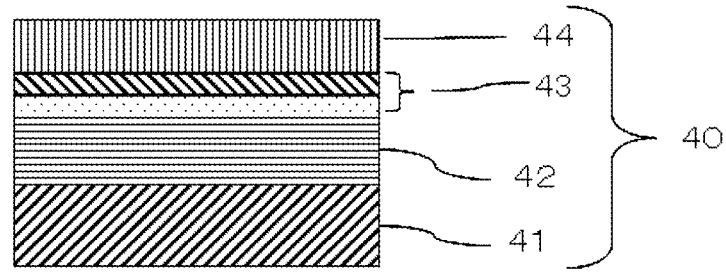

[Figure 5]
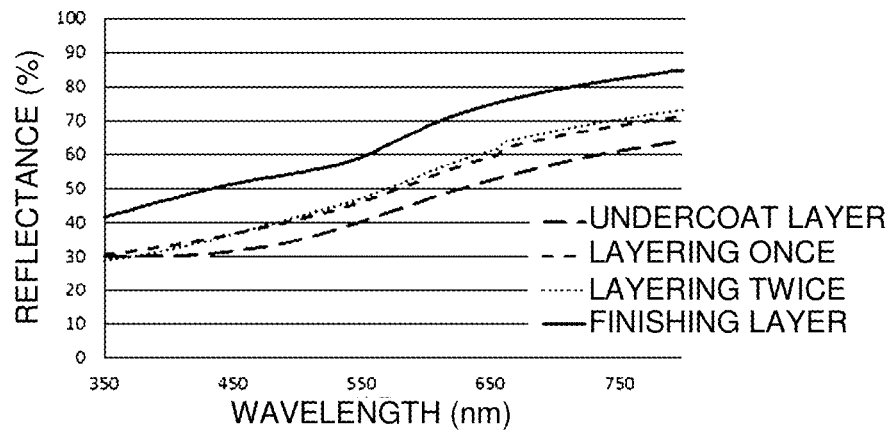
[Figure 6]
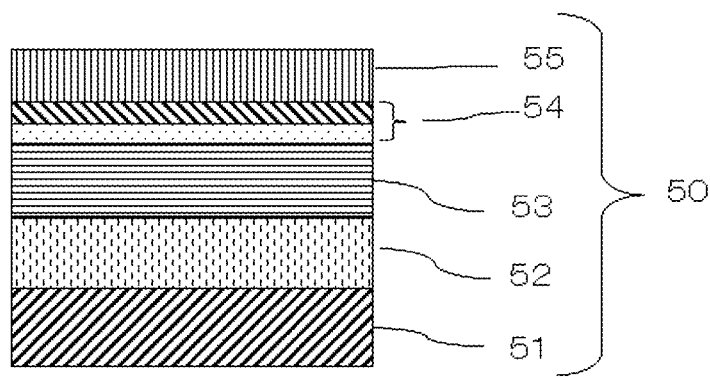
[Figure 7]
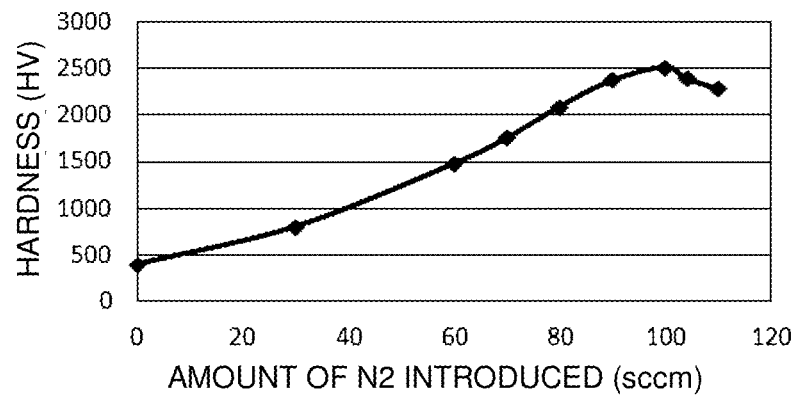

[Figure 8]
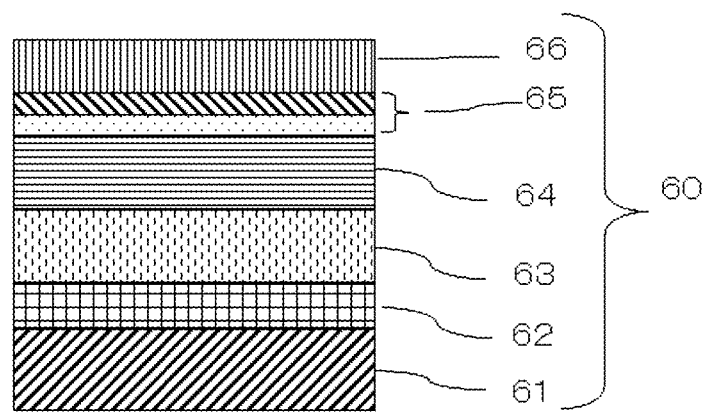
[Figure 9]
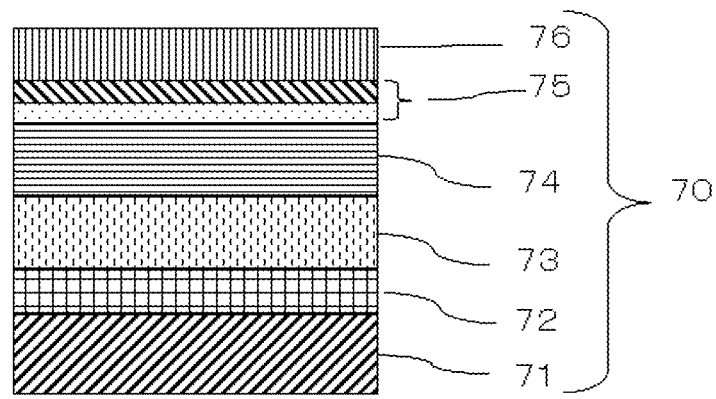

[Figure 10]
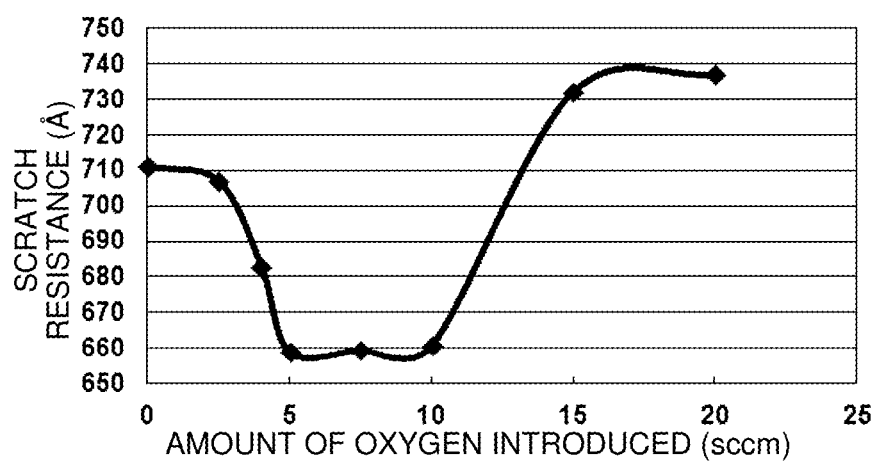
[Figure 11]
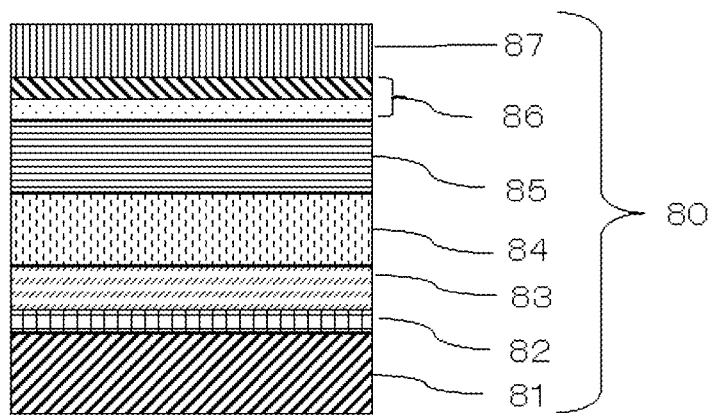

[Figure 12]
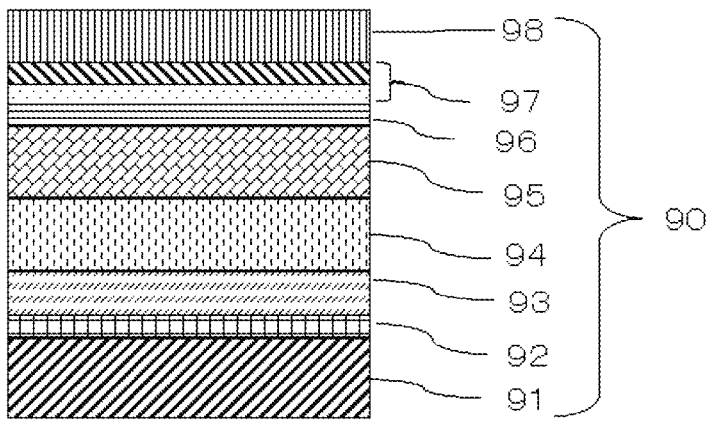
[Figure 13]
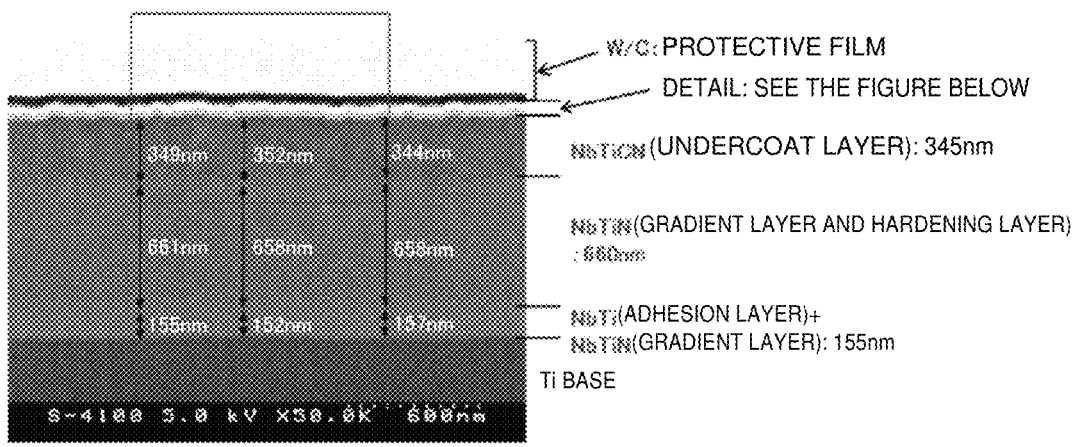
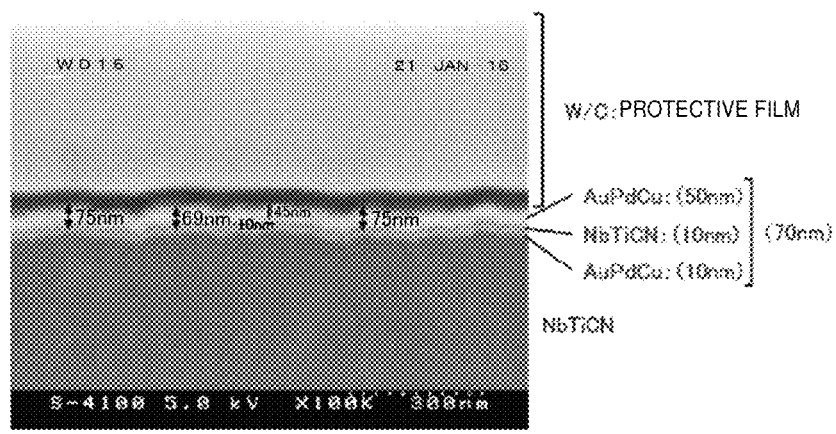

[Figure 14]
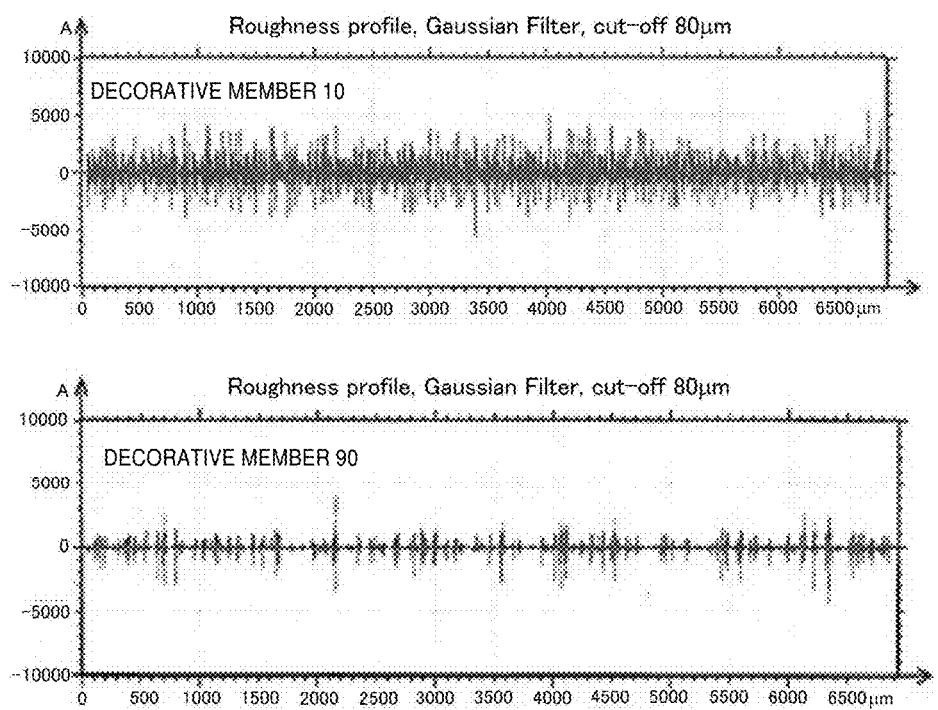
[Figure 15]
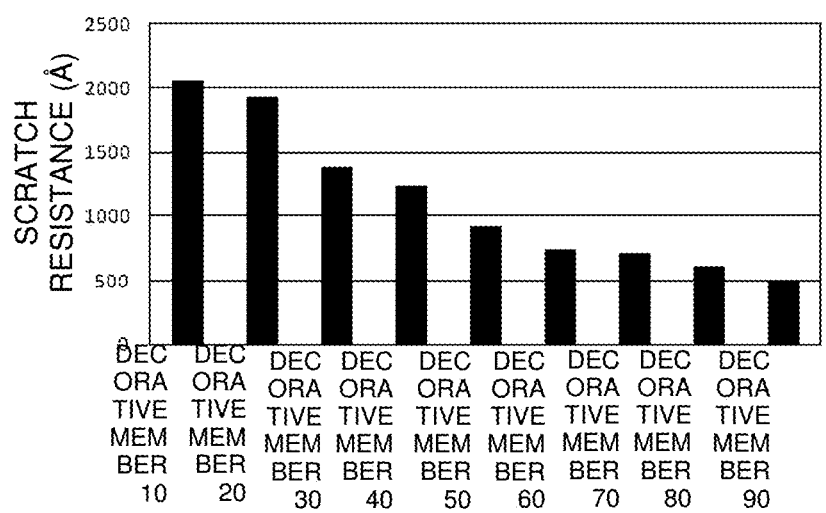

[Figure 16]
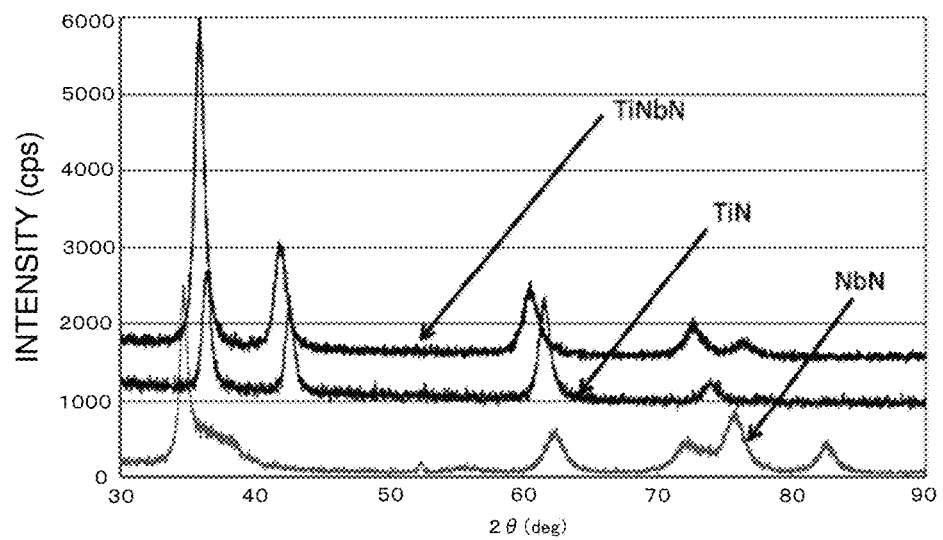
[Figure 17]
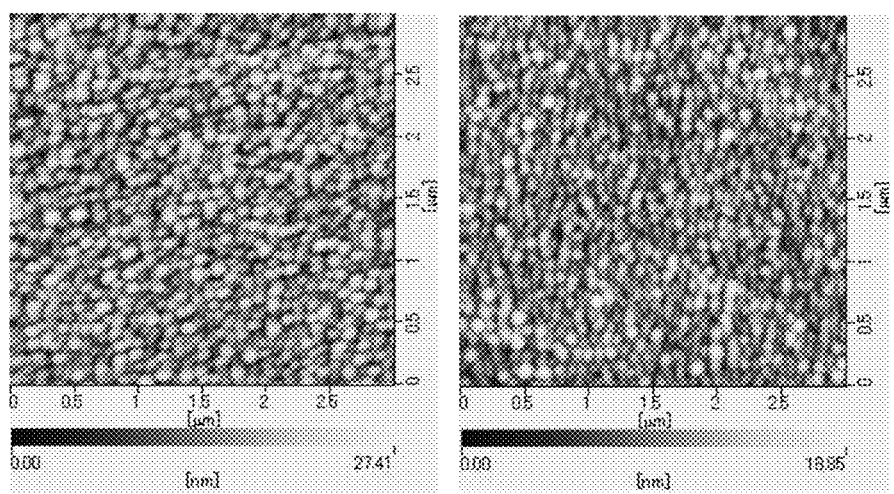

[Figure 18]
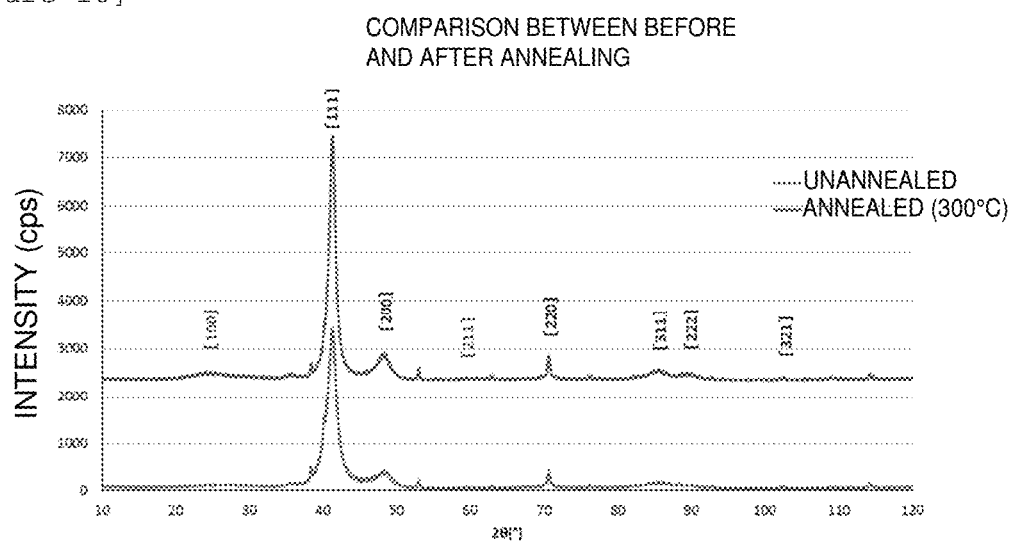

DECORATIVE MEMBER AND METHOD FOR PRODUCING THE SAME

CROSS REFERENCE TO RELATED APPLICATIONS

This application is a National Stage of International Application No. PCT/JP2017/012245 filed Mar. 27, 2017, claiming priority based on Japanese Patent Application No. 2016-072160 filed Mar. 31, 2016.

TECHNICAL FIELD

The present invention relates to a cherry blossom pink hard decorative member and a method for producing the decorative member.

BACKGROUND ART

Decorative articles such as glasses including members such as eyeglass frames; accessories such as necklaces, earrings, piercing jewelries, rings, pendants, brooches, and bracelets; watches including members such as watch cases and watch bands; and sporting goods require high decorativeness. Therefore, attempts have been made to satisfy the aforementioned requirement by forming various decorative coatings on bases such as titanium and stainless steel to produce decorative members. Further, the formation of decorative coatings also can improve the scratch resistance.

For example, Patent Literature 1 discloses a pink decorative member comprising a base and a hardening layer on the base. The hardening layer is formed by layering a base layer; an undercoat layer; and a finishing layer from the base side, wherein the base layer comprises a metal layer having one or more of metals selected from Hf, Ti, and Zr, and a compound layer disposed on the metal layer, the compound layer containing nitrogen, carbon, or oxygen, and the same metals as the metals that constitute the metal layer; the undercoat layer has a layer structure in which a Au alloy layer, and a compound layer containing nitrogen, carbon or oxygen and one or more of metals selected from Hf, Ti, and Zr are alternately layered; and the finishing layer is composed of a Au alloy layer.

CITATION LIST

Patent Literature

Patent Literature 1: International Publication No. WO 2009/038152

SUMMARY OF INVENTION

Technical Problem

Although there have been demands for decorative members having light pale pink colors, particularly, pink colors like Japanese cherry blossoms (in the specification, which may be referred to as cherry blossom pink colors) among pink colors, such pink colors cannot be expressed by the decorative member disclosed in Patent Literature 1.

It is therefore an object of the present invention to provide a decorative member having a cherry blossom pink color and a method for producing the decorative member.

Solution to Problem

A cherry blossom pink decorative member of the present invention comprises a base and a decorative coating formed on the base, wherein the decorative coating is formed by layering an undercoat layer and a finishing layer from the base side, the undercoat layer is a carbonitride layer composed of a carbonitride of a metal containing Ti and at least one selected from Nb and Ta, and the finishing layer is a Au alloy layer composed of an alloy containing Au, a metal having a silver color, and Cu.

Further, a method for producing a cherry blossom pink decorative member of the present invention is a method for producing a decorative member comprising a base and a decorative coating formed on the base, wherein the decorative coating is formed by layering an undercoat layer and a finishing layer from the base side, the method comprising: an undercoat layer layering step of layering the undercoat layer that is a carbonitride layer composed of a carbonitride of a metal containing Ti and at least one selected from Nb and Ta on the base; and a finishing layer layering step of layering the finishing layer that is a Au alloy layer composed of an alloy containing Au, a metal having a silver color, and Cu on the base on which the undercoat layer has been layered.

Advantageous Effects of Invention

The decorative member of the present invention has a cherry blossom pink appearance color. Further, the decorative member of the present invention has excellent scratch resistance.

BRIEF DESCRIPTION OF DRAWINGS

FIG. 1 is a schematic cross-sectional view of a decorative member of Example 1.

FIG. 2 is a schematic cross-sectional view of a decorative member of Example 2.

FIG. 3 is a schematic cross-sectional view of a decorative member of Example 3.

FIG. 4 is a schematic cross-sectional view of a decorative member of Example 4.

FIG. 5 is a graph showing changes in reflectance with respect to the number of layering in an adjustment layer.

FIG. 6 is a schematic cross-sectional view of a decorative member of Example 5.

FIG. 7 is a graph showing a change in hardness with respect to the amount of $N_2$ introduced in a hardening layer.

FIG. 8 is a schematic cross-sectional view of a decorative member of Example 6.

FIG. 9 is a schematic cross-sectional view of a decorative member of Example 7.

FIG. 10 is a graph showing a change in scratch resistance with respect to the amount of oxygen introduced in an adhesion layer (Ti oxide film).

FIG. 11 is a schematic cross-sectional view of a decorative member of Example 8.

FIG. 12 is a schematic cross-sectional view of a decorative member of Example 9.

FIG. 13 is a view showing cross-sectional SEM image of the decorative member of Example 9.

FIG. 14 shows profiles of the decorative member of Example 1 and the decorative member of Example 9 after scratch resistance tests.

FIG. 15 is a graph comparing the scratch resistances of the decorative members of Examples 1 to 9.

FIG. 16 is a graph comparing the crystallinities of a NbTi nitride film, a TiN film, and a NbN film.

FIG. 17 shows surface analysis results using an atomic force microscope.

FIG. 18 is a graph of X-ray diffraction results before and after annealing treatment.

DESCRIPTION OF EMBODIMENTS

<Decorative Member>

The decorative member of the present invention comprises a base and a decorative coating formed on the base, and the decorative coating is formed by layering an undercoat layer and a finishing layer from the base side. The decorative member of the present invention has a cherry blossom pink appearance color and excellent scratch resistance by having the aforementioned configuration.

Hereinafter, embodiments of the decorative member of the present invention will be specifically described.

Embodiment 1

In the decorative member of Embodiment 1, the decorative coating is formed by layering the undercoat layer and the finishing layer from the base side so as to be in contact with each other.

[Base]

The base is formed from a metal, ceramics or a plastic. Examples of the metals (including alloys) specifically include stainless steel, titanium, titanium alloy, copper, copper alloy, and tungsten, or hardened stainless steel, hardened titanium, and hardened titanium alloy. One of these metals can be used alone, or two or more of them can be used in combination. Further, the shape of the base is not limited.

[Undercoat Layer]

The undercoat layer is a carbonitride layer composed of a carbonitride of a metal containing Ti and at least one selected from Nb and Ta. The carbonitride containing the aforementioned specific metal can form an undercoat layer having a light pale pink color, that is, a cherry blossom pink color. The cherry blossom pink color can be achieved by combining nitrogen and carbon with the aforementioned specific metal. In the decorative member of the present invention, even if the finishing layer on the undercoat layer separates, there is almost no inconsistency because the undercoat layer has a cherry blossom pink color.

Further, the combination of Nb and/or Ta with Ti increases the film hardness of the carbonitride layer, thereby improving the scratch resistance and the abrasion resistance of the decorative member. Thus, the presence of the undercoat layer that is sufficiently harder than the base enhances the resistance to scratches and makes the finishing layer less likely to separate. Further, the combination of Nb and/or Ta with Ti also improves the corrosion resistance of the decorative member.

In the case of using a Ti carbonitride, the cherry blossom pink color cannot be achieved. Further, the Ti carbonitride has a film hardness lower than the carbonitride containing Ti and Nb and/or Ta, and therefore the layer thickness needs to be increased, in order to exert the scratch resistance. Therefore, there has been room for improvement in pitting corrosion resistance and throwing power between pieces of watch bands. In contrast, in the case of using the carbonitride containing Ti and Nb and/or Ta, as in the present invention, not only the cherry blossom pink color can be achieved, but also the scratch resistance can be exerted even with a small layer thickness, the pitting corrosion resistance and the throwing power between pieces of watch bands also can be improved. Accordingly, the carbonitride containing Ti and Nb and/or Ta can be used suitably also for watch bands.

In the aforementioned carbonitride, Nb may be used alone, Ta may be used alone, or Nb and Ta may be used in combination. Because Ta has a larger atomic weight than Nb, use of Ta can increase the film hardness and can improve the scratch resistance and the abrasion resistance of the decorative member.

22 to 66 mass % in total of the at least one selected from Nb and Ta, 20 to 50 mass % of Ti, 7 to 19 mass % of nitrogen, and 4 to 15 mass % of carbon are preferably contained in the undercoat layer, assuming that the total amount of nitrogen, carbon, and the metal composed of Ti and the at least one selected from Nb and Ta is 100 mass %. In view of the color tone and the film hardness, the amounts of metal elements and non-metal elements preferably fall within the aforementioned ranges.

In view of the color tone and the film hardness, the thickness of the undercoat layer is preferably 0.05 to 3 μm, more preferably 0.05 to 2 μm. Further, when the thickness of the undercoat layer is 0.05 μm or more, the influence of the color of the base can be reduced.

In view of the scratch resistance and the abrasion resistance, the film hardness of the undercoat layer is preferably 1000 HV or more. For example, the film hardness can be adjusted to the aforementioned range by appropriately changing the film thickness and the amounts of metal elements and non-metal elements constituting the carbonitride.

In the undercoat layer, it is preferable that $a^*$ be 4 to 10, and $b^*$ be 9.5 to 16 in the $L^*a^*b^*$ color system, and it is preferable that h be 55° to 67° in the $L^*C^*h$ color system. When $a^*$, $b^*$, and h fall within the aforementioned ranges, a pale pink color can be achieved, and providing the finishing layer makes the cherry blossom pink color more preferable. Further, even if the finishing layer separates, there is almost no inconsistency. Further, in view of the color tone, it is preferable that $L^*$ be 70 or more in the $L^*a^*b^*$ color system. For example, $L^*$, $a^*$, $b^*$, and h can be adjusted to the aforementioned ranges by appropriately changing the film thickness and the amounts of metal elements and non-metal elements constituting the carbonitride.

[Finishing Layer]

The finishing layer is, for example, a Au alloy layer composed of an alloy containing Au, Pd, and Cu (AuPdCu alloy) and has a cherry blossom pink color. When Au and Cu are contained with a good balance in the Au-containing alloy, a pink color is shown. Mixing a metal having a silver color such as Pd, Pt, and Rh with the AuCu alloy having the pink color lightens the color, to show a cherry blossom pink color. Therefore, the finishing layer is a Au alloy layer composed of an alloy containing Au, a metal having a silver color, and Cu. The metal having a silver color is preferably at least one selected from Pd, Pt, and Rh.

Meanwhile, Cu in the AuCu alloy has low corrosion resistance and may possibly cause discoloration (oxidation) or decoloration in a practical use environment in some cases, such discoloration can be suppressed by containing Pd. Accordingly, in order to achieve a pale cherry blossom pink color, Pd is preferably used among metals having a silver color.

62 to 90 mass % of Au, 2.5 to 17 mass % of Pd, and 5 to 21 mass % of Cu are preferably contained in the finishing layer, assuming that the total amount of Au, Pd, and Cu is 100 mass %. When the amounts of the metal elements fall within the aforementioned ranges, a further preferable cherry blossom pink color is shown.

The thickness of the finishing layer is preferably 0.02 to 0.15 μm, more preferably 0.02 to 0.1 μm. In order to allow the finishing layer to show the cherry blossom pink color, the thickness of the finishing layer is preferably 0.02 μm or more. Meanwhile, the AuPdCu alloy layer, for example, constituting the finishing layer has very low hardness and is susceptible to scratches and further to abrasion. Accordingly, in consideration of the scratch resistance, it is better that the film thickness of the finishing layer be as thin as possible. Further, even if a film more than 0.1 μm is formed, there is no change in color tone, and further the production cost increases. Therefore, the thickness of the finishing layer is preferably 0.15 μm or less, more preferably 0.1 μm or less.

The film hardness of the finishing layer is generally about 100 to 400 HV, preferably about 150 to 400 HV. For example, the film hardness can be adjusted to the aforementioned ranges by appropriately changing the amounts of metal elements constituting the Au alloy such as the AuPdCu alloy.

The finishing layer preferably has a peak corresponding to the [100] plane and/or the [211] plane of the Au alloy crystal in a diffraction pattern obtained by the X-ray diffraction measurement. The peak of the [100] plane is generally observed around 24 degrees, and the peak of the plane is generally observed around 60 degrees. In the case of a film that is thin as compared with common metal crystals, crystal grains tend to be small and tend to be oriented on a certain crystal plane. However, a crystallinity that is closer to the metal crystal appears, for example, by subjecting to annealing treatment, which will be described below, and a decorative member having such a finishing layer is more excellent in brightness, hardness, and scratch resistance.

The finishing layer preferably has an integrated intensity II at the peak corresponding to the [100] plane of 5% or more, more preferably 5% to 20%, further preferably 5% to 15%, with respect to an integrated intensity I at the peak corresponding to the [111] plane, in a diffraction pattern obtained by the X-ray diffraction measurement. Alternatively, the finishing layer preferably has an integrated intensity III at the peak corresponding to the [211] plane of 2% or more, more preferably 2% to 15%, further preferably 2% to 10%, with respect to the integrated intensity I at the peak corresponding to the [111] plane. If the integrated intensities on the [100] plane and the [211] plane in the Au alloy crystal of the finishing layer fall within the aforementioned ranges, the crystal grains of the Au alloy crystal are not excessively enlarged, and cloudy appearance of the finishing layer due to scattering of light can be prevented.

The finishing layer having the aforementioned properties can be obtained, for example, by subjecting to annealing treatment, which will be described below.

In the finishing layer, it is preferable that L* be 80 or more, a* be 4 to 10, and b* be 9.5 to 16 in the L*a*b* color system, and it is preferable that h be 55° to 67° in the L*C*h color system. When L*, a*, b*, and h fall within the aforementioned ranges, a preferable cherry blossom pink color with high brightness is given. For example, L*, a*, b*, and h can be adjusted to the aforementioned ranges by appropriately changing the film thickness and the amounts of metal elements constituting the Au alloy such as the AuPdCu alloy.

Embodiment 2

The decorative member of the present invention may be a decorative member in which the decorative coating further comprises an adjustment layer and which is formed by layering the undercoat layer, the adjustment layer, and the finishing layer from the base side so as to be in contact with one another (Embodiment 2).

In Embodiment 2, the base, the undercoat layer, and the finishing layer are the same as described in Embodiment 1.

[Adjustment Layer]

The adjustment layer has a layer structure in which a Au alloy layer composed of an alloy containing Au, Pd, and Cu, and a carbonitride layer composed of a carbonitride of a metal containing Ti and at least one selected from Nb and Ta are alternately layered. The aforementioned layer structure can form an adjustment layer having a cherry blossom pink color. In the adjustment layer, the layer in contact with the undercoat layer is the aforementioned Au alloy layer, and the layer in contact with the finishing layer is the aforementioned carbonitride layer.

Providing the adjustment layer on the undercoat layer increases the brightness (L*) due to the layering effect of the Au alloy layer of the adjustment layer. Therefore, the color tone difference between the finishing layer and the adjustment layer is smaller than the color tone difference between the undercoat layer and the finishing layer, so that inconsistency is further suppressed, even if the finishing layer on the adjustment layer separates. Further, deep scratches are stopped by the carbonitride layer of the adjustment layer, which contributes also to improving the scratch resistance of the decorative member.

Preferable amounts of metal elements in the Au alloy layer of the adjustment layer and the reason thereof are the same as described above for the finishing layer, and preferable amounts of metal elements and non-metal elements in the carbonitride layer of the adjustment layer and the reason thereof are the same as described above for the undercoat layer.

The thickness of the Au alloy layer and the thickness of the carbonitride layer in the adjustment layer are each preferably 0.005 to 0.016 μm. If the carbonitride layer is thinner than 0.005 μm, it is difficult to obtain the scratch reduction effect by the layer. Further, if the carbonitride layer is thicker than 0.016 μm, it is difficult to obtain the color deepening effect by layering, and the color tone can be the same as in the undercoat layer. Further, when the Au alloy layer is thinner than 0.005 μm, it is difficult to obtain the color deepening effect by the layer. Further, if the Au alloy layer is thicker than 0.016 μm, it is difficult to obtain the scratch reduction effect by layering.

The adjustment layer preferably has a layer structure in which a unit of one Au alloy layer and one carbonitride layer is repeated once or twice.

If the aforementioned unit is repeated more than twice, not only the brightness (L*) but also the hue angle (h) increases in the same manner, and the cherry blossom pink color adjusted in the undercoat layer may possibly be lost in some cases. Further, as the number of the repetition increases, the process time also increases, and therefore the number of the repetition is preferably twice or less.

In the adjustment layer, it is preferable that L* be 72 or more, a* be 4 to 10, and b* be 9.5 to 16 in the L*a*b* color system, and it is preferable that h be 55° to 67° in the L*C*h color system. When L*, a*, b*, and h fall within the aforementioned ranges, a cherry blossom pink color having a higher brightness than the undercoat layer is given. L*, a*, b*, and h can be adjusted to the aforementioned ranges, for example, by appropriately changing the amounts of metal elements constituting the AuPdCu alloy, the amounts of metal elements and non-metal elements constituting the carbonitride, the film thickness of the Au alloy layer or the carbonitride layer, and the number of repetitions of the aforementioned units.

Embodiment 3

The decorative member of the present invention may be a decorative member in which the decorative coating further comprises a hardening layer and which is formed by layering the hardening layer, the undercoat layer, and the finishing layer from the base side so as to be in contact with one another (Embodiment 3).

In Embodiment 3, the base, the undercoat layer, and the finishing layer are the same as described in Embodiment 1.

[Hardening Layer]

The hardening layer is a nitride layer composed of a nitride of a metal containing Ti and at least one selected from Nb and Ta. Providing the hardening layer increases the overall hardness (composite hardness) of the decorative member and contributes to improving the scratch resistance.

In the aforementioned nitride, Nb may be used alone, Ta may be used alone, or Nb and Ta may be used in combination. Because Ta has a larger atomic weight than Nb, use of Ta can increase the film hardness to improve the scratch resistance and the abrasion resistance of the decorative member.

22 to 66 mass % in total of the at least one selected from Nb and Ta, 20 to 55 mass % of Ti, and 8 to 35 mass % of nitrogen are preferably contained in the hardening layer, assuming that the total amount of nitrogen and the metal composed of Ti and the at least one selected from Nb and Ta is 100 mass %. In view of the film hardness, the amounts of metal elements and non-metal elements preferably fall within the aforementioned ranges.

In view of the film hardness and the abrasion resistance, the thickness of the hardening layer is preferably 0.5 to 3 μm.

In view of the scratch resistance and the abrasion resistance, the film hardness of the hardening layer is preferably 1500 to 3000 HV. The film hardness can be adjusted to the aforementioned range, for example, by appropriately changing the film thickness and the amounts of metal elements and non-metal elements constituting the nitride.

Embodiment 4

The decorative member of the present invention may be a decorative member in which the decorative coating further comprises an adhesion layer and which is formed by layering the adhesion layer, the hardening layer, the undercoat layer, and the finishing layer from the base side so as to be in contact with one another (Embodiment 4).

In Embodiment 4, the base, the undercoat layer, and the finishing layer are the same as described in Embodiment 1, and the hardening layer is the same as described in Embodiment 3.

[Adhesion Layer]

The adhesion layer composed of a metal layer has excellent adhesion to the base, and therefore providing the adhesion layer can improve the scratch resistance of the decorative member.

Specifically, the adhesion layer is preferably a Ti alloy layer composed of a metal containing Ti and at least one selected from Nb and Ta.

In order to improve the adhesion, 25 to 75 mass % in total of the at least one selected from Nb and Ta and 25 to 75 mass % of Ti are preferably contained in the adhesion layer, assuming that the total amount of Ti and the at least one selected from Nb and Ta is 100 mass %.

Further, the adhesion layer is also preferably a Ti layer composed of Ti and optionally containing oxygen. Providing a Ti layer as the adhesion layer allows high adhesion also to stainless steel to be obtained and therefore can ensure high scratch resistance. The Ti layer has good compatibility not only with stainless steel but also with bases such as SK materials and brasses and exhibits high adhesion also to these bases.

Further, introduction of oxygen into the Ti layer can further improve the adhesion to the base. In view of the adhesion, the amount of oxygen to be introduced into the Ti layer is preferably more than 0 mass % and 50 mass % or less, assuming that the total amount of the Ti layer is 100 mass %. Although the reason why the introduction of oxygen improves the adhesion is not clear, it is inferred that excess unpaired electrons that have failed to be transformed into oxides serve as a glue that bonds between the base and the adhesion layer and between the adhesion layer and the hardening layer that is a layer thereabove.

In view of the adhesion, the thickness of the adhesion layer is preferably 0.02 to 0.5 μm. Even if the thickness of the adhesion layer is increased to more than 0.5 μm, there is no difference in adhesion, and the production cost is also increased. Therefore, the thickness of the adhesion layer preferably falls within the aforementioned range.

The adhesion layer to be used may be formed by layering a Ti alloy layer composed of a metal containing Ti and at least one selected from Nb and Ta, and a Ti layer composed of Ti and optionally containing oxygen. In this case, each layer preferably has a thickness in the aforementioned range.

The film hardness of the adhesion layer is preferably 200 to 1000 HV. Because the film hardness and the film stress (force directed away from the base) are proportional to each other, the film hardness of the adhesion layer is desirably as low as possible. For example, the film hardness can be adjusted to the aforementioned range by appropriately changing the film thickness and the amounts of constituent elements.

Embodiment 5

The decorative member of the present invention may be a decorative member in which the decorative coating further comprises a gradient layer and which is formed by layering the adhesion layer, the gradient layer, the hardening layer, the undercoat layer, and the finishing layer from the base side so as to be in contact with one another (Embodiment 5).

In Embodiment 5, the base, the undercoat layer, and the finishing layer are the same as described in Embodiment 1, the hardening layer is the same as described in Embodiment 3, and the adhesion layer is the same as described in Embodiment 4.

[Gradient Layer]

The gradient layer is a nitride layer composed of a nitride of a metal containing Ti and at least one selected from Nb and Ta, and the amount of nitrogen in the nitride increases as the distance from the base increases in the thickness direction of the decorative coating.

Providing the gradient layer dramatically mitigates the difference in film stress between the adhesion layer and the hardening layer, to improve the overall adhesion of the decorative member, thereby improving the scratch resistance. Further, the mitigation of the stress difference suppresses the occurrence of cracks. Further, it also can dramatically improve defects such as interlayer separation in long-term use. Such a structure as in Embodiment 5 enables a further increase in film thickness of the hardening layer. For example, even if the thickness of the hardening layer is increased to 2.5 µm, and the overall thickness of the decorative coating is set to 3.0 µm, film separation and cracks are less likely to occur. Further, the overall composite hardness of the decorative member increases, which therefore dramatically improves the scratch resistance, as well. As the hardness of the finishing layer composed of a Au alloy such as AuPdCu alloy is limited, the overall composite hardness of the decorative member and thus the scratch resistance plateaus, even if the thickness of the hardening layer is increased to increase the overall thickness of the decorative coating. Therefore, the overall thickness of the decorative coating is preferably 3.0 µm or less.

In order to mitigate the difference in film stress, the amount of nitrogen in the nitride is preferably zero on the side of the adhesion layer that is a layer under the gradient layer and increases from the adhesion layer side toward the hardening layer side in the thickness direction of the decorative coating so as to be the same as the amount of nitrogen in the hardening layer on the side of the hardening layer that is a layer above the gradient layer. The increase in the amount of nitrogen may be in a continuous manner such as a linear or curved manner, or may be in a discontinuous or intermittent manner such as a stepwise manner.

Further, in order to mitigate the difference in film stress, the proportion of Nb and/or Ta and the proportion of Ti with respect to the total amount of Ti and Nb and/or Ta are preferably the same among the gradient layer, the adhesion layer that is a layer therebelow, and the hardening layer that is a layer thereabove.

The thickness of the gradient layer is preferably 0.04 to 0.6 µm, in order to mitigate the difference in film stress.

Embodiment 6

The decorative member of the present invention may be a decorative member in which the decorative coating further comprises an undercoat gradient layer and which is formed by layering the adhesion layer, the gradient layer, the hardening layer, the undercoat gradient layer, the undercoat layer, and the finishing layer from the base side so as to be in contact with one another (Embodiment 6).

In Embodiment 6, the base, the undercoat layer, and the finishing layer are the same as described in Embodiment 1, the hardening layer is the same as described in Embodiment 3, the adhesion layer is the same as described in Embodiment 4, and the gradient layer is the same as described in Embodiment 5.

[Undercoat Gradient Layer]

The undercoat gradient layer is a carbonitride layer composed of a carbonitride of a metal containing Ti and at least one selected from Nb and Ta. The amount of nitrogen in the carbonitride decreases as the distance from the base increases in the thickness direction of the decorative coating, and the amount of carbon in the carbonitride increases as the distance from the base increases in the thickness direction of the decorative coating.

Providing the undercoat gradient layer mitigates the stress difference between the hardening layer and the undercoat layer, to improve the overall adhesion of the decorative member, thereby improving the scratch resistance.

Such a structure as in Embodiment 6 increases the overall composite hardness of the decorative member and also can improve the scratch resistance.

In order to mitigate the difference in film stress, the amount of nitrogen in the carbonitride preferably decreases from the hardening layer side toward the undercoat layer side in the thickness direction of the decorative coating so as to be the same as the amount of nitrogen in the hardening layer on the side of the hardening layer that is a layer under the undercoat gradient layer and to be the same as the amount of nitrogen in the undercoat layer on the side of the undercoat layer that is a layer above the undercoat gradient layer. Further, in order to mitigate the difference in film stress, the amount of carbon in the carbonitride is preferably zero on the side of the hardening layer that is a layer under the undercoat gradient layer and increases from the hardening layer side toward the undercoat layer side in the thickness direction of the decorative coating so as to be the same as the amount of carbon in the undercoat layer on the side of the undercoat layer that is a layer above the undercoat gradient layer. The decrease in the amount of nitrogen and the increase in the amount of carbon may be in a continuous manner such as a linear or curved manner, or may be in a discontinuous or intermittent manner such as a stepwise manner.

Further, in order to mitigate the difference in film stress, the proportion of Nb and/or Ta and the proportion of Ti with respect to the total amount of Ti and Nb and/or Ta are preferably the same among the undercoat gradient layer, the hardening layer that is a layer therebelow, and the undercoat layer that is a layer thereabove.

In order to mitigate the difference in film stress, the thickness of the undercoat gradient layer is preferably 0.02 to 0.5 µm.

Other Embodiments

The decorative coating of the decorative member of the present invention is not specifically limited, as long as the undercoat layer and the finishing layer are layered from the base side. As the decorative member of the present invention, embodiments appropriately combining the adhesion layer, the gradient layer, the hardening layer, the undercoat gradient layer, and the adjustment layer described above with the undercoat layer and the finishing layer can be specifically mentioned, other than Embodiments 1 to 6. More specific examples are as follows.

Base/Hardening layer/Undercoat layer/Adjustment layer/Finishing layer

Base/Adhesion layer/Hardening layer/Undercoat layer/Adjustment layer/Finishing layer Base/Adhesion layer/Gradient layer/Hardening layer/Undercoat layer/Adjustment layer/Finishing layer Base/Adhesion layer/Gradient layer/Hardening layer/Undercoat gradient layer/Undercoat layer/Adjustment layer/Finishing layer Base/Gradient layer/Hardening layer/Undercoat layer/Finishing layer Base/Gradient layer/Hardening layer/Undercoat layer/Adjustment layer/Finishing layer Base/Gradient layer/Hardening layer/Undercoat gradient layer/Undercoat layer/Finishing layer Base/Gradient layer/Hardening layer/Undercoat gradient layer/Undercoat layer/Adjustment layer/Finishing layer Base/Adhesion layer/Undercoat layer/Finishing layer Base/Adhesion layer/Undercoat layer/Adjustment layer/Finishing layer Base/Hardening layer/Undercoat gradient layer/Undercoat layer/Finishing layer Base/Hardening layer/Undercoat gradient layer/Undercoat layer/Adjustment layer/Finishing layer Base/Adhesion layer/Hardening layer/Undercoat gradient layer/Undercoat layer/Finishing layer Base/Adhesion layer/Hardening layer/Undercoat gradient layer/Undercoat layer/Adjustment layer/Finishing layer In the decorative coating, one adhesion layer may be layered, or two or more adhesion layers may be layered. The same applies to the gradient layer, the hardening layer, the undercoat gradient layer, the undercoat layer, the adjustment layer, and the finishing layer. Further, in the decorative coating, other layers may be formed between the layers described above, as long as the effects of the present invention are not impaired.

In view of the scratch resistance and the abrasion resistance, the thickness of the decorative coating in the decorative member of the present invention is preferably 0.3 to 3.0 μm.

In any one of the aforementioned embodiments, the decorative member of the present invention has a cherry blossom pink color, and specifically it is preferable that $L^*$ be 80 or more, $a^*$ be 4 to 10, and $b^*$ be 9.5 to 16 in the $L^*a^*b^*$ color system, and it is preferable that h be 55° to 67° in the $L^*C^*h$ color system. When $L^*$, $a^*$, $b^*$, and h fall within the aforementioned ranges, the decorative member exhibits a further preferable cherry blossom pink color.

Further, in any one of the aforementioned embodiments, the decorative member of the present invention has high film hardness, and specifically the film hardness is preferably 1000 HV or more. When the film hardness falls within the aforementioned range, the decorative member can exert further excellent scratch resistance.

Further, in any one of the aforementioned embodiments, the decorative member of the present invention has excellent corrosion resistance.

Further, in an embodiment of the decorative member of the present invention, it is considered that because a complex phase (intermetallic compound) containing Ti and Nb and/or Ta, and Au, Pd, and Cu is formed at the interface between the undercoat layer composed of a carbonitride containing Ti and Nb and/or Ta and the finishing layer composed of a Au alloy containing Au, Pd, and Cu, the adhesion between layers is high, and the scratch resistance of the decorative member is improved. It is considered that, in the case of using a Ti carbonitride free from Nb and/or Ta, the aforementioned phase is not formed.

It is considered that because Ti and Nb and/or Ta used in the decorative member of the present invention have solid solution conditions, Ti and Nb and/or Ta exhibit a metal alloy compound in the solid solution condition region and are in the complex form of a solid solution metal and a single metal in the other region. In the specification, reaction compounds such as carbonitrides and nitrides include those in the aforementioned complex form. Further, the exhibition of an alloy compound can also be specifically confirmed from the results of X-ray diffraction. Because the diffraction peak of the compound shifts depending on the alloy ratio of Ti and Nb and/or Ta, it can be confirmed that the formed compound of Ti and Nb and/or Ta is an alloy compound corresponding to the respective ratios.

The amounts of elements in each layer described above, the thickness of each layer described above, the overall thickness of the decorative member, the hardness of each layer, the overall hardness of the decorative member, the color tone of each layer, and the overall color tone of the decorative member can be determined by the methods described in Examples.

<Method for Producing Decorative Member>

The method for producing a decorative member of the present invention is a method for producing the decorative member as described above and comprises an undercoat layer layering step and a finishing layer layering step. In the undercoat layer layering step and the finishing layer layering step, the undercoat layer and the finishing layer are formed, for example, by a sputtering method such as a reactive sputtering method, or a dry metal plating method such as an ion plating method and an arc ion plating method.

In the sputtering method, a high DC or AC voltage is applied between a base and a target composed of the constituent atoms of the coating while introducing an inert gas into a chamber evacuated to a vacuum, to allow ionized Ar to collide with the target thereby forming the sputtered target substance on the base. In the reactive sputtering method, a reaction gas is introduced together with the inert gas to form a coating of a reaction compound of the target constituent atoms with non-metal elements constituting the reaction gas on the base.

Hereinafter, production methods of specific embodiments of the decorative member of the present invention will be described.

Production Method of Embodiment 1

In the undercoat layer layering step, an undercoat layer that is a carbonitride layer composed of a carbonitride of a metal containing Ti and at least one selected from Nb and Ta is layered on a base, for example, by a reactive sputtering method.

In the undercoat layer layering step, an alloy combining Nb and/or Ta with Ti, more specifically, a sintered body of the aforementioned metal alloy is preferably used as a target (raw material metal). In the aforementioned sintered body, the types and the proportions of metals can be appropriately selected so that a desired undercoat layer is obtained.

Examples of the reaction gas to be used include a carbon atom-containing gas such as methane gas and acetylene gas, and a nitrogen atom-containing gas such as nitrogen gas and ammonia. Examples of the inert gas include Ar gas, Kr gas, and Xe gas.

The amounts of metal elements and non-metal elements in the reaction compound or the like can be adjusted by appropriately changing the applied voltage, the types and the proportions of the target constituent atoms, and the selection and the amount of the reaction gas.

In the finishing layer layering step, a finishing layer that is a Au alloy layer composed of an alloy containing Au, a metal having a silver color (example: Pd), and Cu is layered on the base on which the undercoat layer has been layered, for example, by a sputtering method.

In the finishing layer layering step, an alloy combining Au, a metal having a silver color (example: Pd), and Cu, more specifically, a sintered body of the aforementioned metal alloy is preferably used as a target (raw material metal). In the aforementioned sintered body, the types and the proportions of metals can be appropriately selected so that a desired finishing layer is obtained.

Examples of the inert gas include Ar gas, Kr gas, and Xe gas.

The amounts of metal elements in the Au alloy or the like can be adjusted by appropriately changing the applied voltage, the proportions of the target constituent atoms, or the like.

Production Method of Embodiment 2

The production method of Embodiment 2 further comprises an adjustment layer layering step in addition to the production method of Embodiment 1. That is, in the adjustment layer layering step, an adjustment layer having a layer structure in which a Au alloy layer composed of an alloy containing Au, Pd, and Cu, and a carbonitride layer composed of a carbonitride of a metal containing Ti and at least one selected from Nb and Ta are alternately layered is layered on the undercoat layer, for example, by a sputtering method; and in the finishing layer layering step, a finishing layer that is a Au alloy layer composed of an alloy containing Au, a metal having a silver color (example: Pd), and Cu is layered on the base on which the adjustment layer has been layered, for example, by a sputtering method.

In Embodiment 2, the undercoat layer layering step and the finishing layer layering step are the same as described in the production method of Embodiment 1.

Specifically, in the adjustment layer layering step, the Au alloy layer can be formed in the same manner as in the finishing layer layering step of Embodiment 1, and the carbonitride layer can be formed in the same manner as in the undercoat layer layering step of Embodiment 1.

Production Method of Embodiment 3

The production method of Embodiment 3 further comprises a hardening layer layering step in addition to the production method of Embodiment 1. That is, in the hardening layer layering step, a hardening layer that is a nitride layer composed of a nitride of a metal containing Ti and at least one selected from Nb and Ta is layered on a base, for example, by a reactive sputtering method, and in the undercoat layer layering step, an undercoat layer that is a carbonitride layer composed of a carbonitride of a metal containing Ti and at least one selected from Nb and Ta is layered on the base on which the hardening layer has been layered, for example, by a reactive sputtering method.

In Embodiment 3, the undercoat layer layering step and the finishing layer layering step are the same as described in the production method of Embodiment 1.

In the hardening layer layering step, an alloy combining Nb and/or Ta with Ti, more specifically, a sintered body of the aforementioned metal alloy is preferably used as a target (raw material metal). In the aforementioned sintered body, the types and the proportions of metals can be appropriately selected so that a desired hardening layer is obtained.

Examples of the reaction gas to be used include a nitrogen atom-containing gas such as nitrogen gas and ammonia. Examples of the inert gas include Ar gas, Kr gas, and Xe gas.

The amounts of metal elements and non-metal elements in the reaction compound or the like can be adjusted by appropriately changing the applied voltage, the types and the proportions of the target constituent atoms, and the selection and the amount of the reaction gas.

Production Method of Embodiment 4

The production method of Embodiment 4 further comprises an adhesion layer layering step in addition to the production method of Embodiment 3. That is, in the adhesion layer layering step, an adhesion layer that is a Ti alloy layer composed of a metal containing Ti and at least one selected from Nb and Ta is layered on a base, for example, by a sputtering method; and in the hardening layer layering step, a hardening layer that is a nitride layer composed of a nitride of a metal containing Ti and at least one selected from Nb and Ta is layered on the base on which the adhesion layer has been layered, for example, by a reactive sputtering method.

In Embodiment 4, the undercoat layer layering step and the finishing layer layering step are the same as described in the production method of Embodiment 1, and the hardening layer layering step is the same as described in Embodiment 3.

In the adhesion layer layering step, an alloy combining Nb and/or Ta with Ti, more specifically, a sintered body of the aforementioned metal alloy is preferably used as a target (raw material metal). In the aforementioned sintered body, the types and the proportions of metals can be appropriately selected so that a desired adhesion layer is obtained.

Examples of the inert gas to be used include Ar gas, Kr gas, and Xe gas.

The amounts of metal elements or the like in the Ti alloy can be adjusted by appropriately changing the applied voltage, the types and the proportions of the target constituent atoms, or the like.

Further, in the adhesion layer layering step, an adhesion layer that is a Ti layer composed of Ti and optionally containing oxygen may be layered on the base, for example, by a sputtering method.

In this case, in the adhesion layer layering step, Ti is preferably used as a target (raw material metal).

Examples of the reaction gas to be used include oxygen gas. Examples of the inert gas include Ar gas, Kr gas, and Xe gas.

The amount of oxygen or the like in the Ti layer can be adjusted by appropriately changing the applied voltage, the selection and the amount of the reaction gas, or the like.

Production Method of Embodiment 5

The production method of Embodiment 5 further comprises a gradient layer layering step in addition to the production method of Embodiment 4. That is, in the gradient layer layering step, a gradient layer that is a nitride layer composed of a nitride of a metal containing Ti and at least one selected from Nb and Ta is layered on the base on which the adhesion layer has been layered, for example, by a reactive sputtering method; and in the hardening layer layering step, a hardening layer that is a nitride layer composed of a nitride of a metal containing Ti and at least one selected from Nb and Ta is layered on the base on which the gradient layer has been formed, for example, by a reactive sputtering method. Further, in the gradient layer layering step, the nitride layer is layered so that the amount of nitrogen in the nitride increases as the distance from the base increases in the thickness direction of the decorative coating.

In Embodiment 5, the undercoat layer layering step and the finishing layer layering step are the same as described in the production method of Embodiment 1, the hardening layer layering step is the same as described in Embodiment 3, and the adhesion layer layering step is the same as described in Embodiment 4.

In the gradient layer layering step, an alloy combining Nb and/or Ta with Ti, more specifically, a sintered body of the aforementioned metal alloy is preferably used as a target (raw material metal). In the aforementioned sintered body, the types and the proportions of metals can be appropriately selected so that a desired gradient layer is obtained.

Examples of the reaction gas to be used include a nitrogen atom-containing gas such as nitrogen gas and ammonia. Examples of the inert gas include Ar gas, Kr gas, and Xe gas.

The amounts of metal elements and non-metal elements in the reaction compound or the like can be adjusted by appropriately changing the applied voltage, the types and the proportions of the target constituent atoms, and the selection and the amount of the reaction gas. Further, the gradient layer may be formed, while increasing the nitrogen atom-containing gas, in order to increase the amount of nitrogen in the nitride as the distance from the base increases in the thickness direction of the decorative coating.

Production Method of Embodiment 6

The production method of Embodiment 6 further comprises an undercoat gradient layer layering step in addition to the production method of Embodiment 5. That is, in the undercoat gradient layer layering step, an undercoat gradient layer that is a carbonitride layer composed of a carbonitride of a metal containing Ti and at least one selected from Nb and Ta is layered on the base on which the hardening layer has been layered, for example, by a reactive sputtering method, and in the undercoat layer step, an undercoat layer that is a carbonitride layer composed of a carbonitride of a metal containing Ti and at least one selected from Nb and Ta is layered on the base on which the undercoat gradient layer has been layered, for example, by a reactive sputtering method. Further, in the undercoat gradient layer layering step, the carbonitride layer is layered so that the amount of nitrogen in the carbonitride decreases as the distance from the base increases in the thickness direction of the decorative coating, and the amount of carbon in the carbonitride increases as the distance from the base increases in the thickness direction of the decorative coating.

In the undercoat gradient layer layering step, an alloy combining Nb and/or Ta with Ti, more specifically, a sintered body of the aforementioned metal alloy is preferably used as a target (raw material metal). In the aforementioned sintered body, the types and the proportions of metals can be appropriately selected so that a desired undercoat gradient layer is obtained.

Examples of the reaction gas to be used include a carbon atom-containing gas such as methane gas and acetylene gas, and a nitrogen atom-containing gas such as nitrogen gas and ammonia. Examples of the inert gas include Ar gas, Kr gas, and Xe gas.

The amounts of metal elements and non-metal elements in the reaction compound or the like can be adjusted by appropriately changing the applied voltage, the types and the proportions of the target constituent atoms, and the selection and the amount of the reaction gas. Further, the undercoat gradient layer may be formed, while decreasing the nitrogen atom-containing gas and increasing the carbon atom-containing gas, in order to decrease the amount of nitrogen in the carbonitride and increase the amount of carbon in the carbonitride, as the distance from the base increases in the thickness direction of the decorative coating.

Production Method of Embodiment 7

The production method of Embodiment 7 further comprises an annealing treatment step, in the method for producing a decorative member of the present invention, for example, in the production methods of Embodiments 1 to 6. The annealing treatment step is a step of subjecting the obtained decorative member to annealing treatment.

The annealing treatment temperature is preferably 200 to 500° C., more preferably 200 to 400° C., further preferably 200 to 350° C. If heating is performed within the temperature ranges, the crystal grains of the Au alloy crystal are not excessively enlarged, and dullness due to scattering of light can be prevented.

Further, the annealing treatment time is preferably 0.5 to 5 hours, more preferably 1 to 4 hours. Annealing treatment for the lower limit value of the aforementioned range or longer can allow crystals to sufficiently grow. There may be no difference in crystal growth, even if annealing treatment is continued for over the aforementioned range.

Annealing treatment is preferably performed under reduced pressure conditions.

Annealing treatment can increase the brightness and the hardness of the decorative member and also can improve the scratch resistance of the decorative member.

Production Methods of Other Embodiments

In the production methods of other embodiments, the adhesion layer layering step, the gradient layer layering step, the hardening layer layering step, the undercoat gradient layer layering step, the adjustment layer layering step, and the annealing treatment step described above are, for example, appropriately combined with the undercoat layer layering step and the finishing layer layering step described above.

According to such a method for producing a decorative member of the present invention, a decorative member having the features described above can be produced.

<Decorative Articles Including Decorative Member>

Examples of a decorative article including the decorative member of the present invention include glasses including members such as eyeglass frames; accessories such as necklaces, earrings, piercing jewelries, rings, pendants, brooches, and bracelets; watches including members such as watch cases and watch bands; and sporting goods. These decorative articles may be partially composed of the aforementioned decorative member or may be fully composed of the aforementioned decorative member and can be produced by known methods using the aforementioned decorative member.

The watches may be any one of photovoltaic watches, thermoelectric watches, radio-receiving self-correcting watches, mechanical watches, and common electronic watches. In particular, wristwatches are examples of decorative articles susceptible to scratches due to abrasion with shirts or collision with desks, walls, or the like. Forming the decorative member of the present invention into a watch makes scratches less likely to occur over the years and can maintain the color tone and the appearance of the cherry blossom pink color in a very beautiful state.

From above, the present invention relates to the following.

[1] A cherry blossom pink decorative member comprising a base and a decorative coating formed on the base, wherein the decorative coating is formed by layering an undercoat layer and a finishing layer from the base side, the undercoat layer is a carbonitride layer composed of a carbonitride of a metal containing Ti and at least one selected from Nb and Ta, and the finishing layer is a Au alloy layer composed of an alloy containing Au, a metal having a silver color, and Cu.

The decorative member of the present invention has a cherry blossom pink appearance color and excellent scratch resistance by having the aforementioned configuration.

[2] The cherry blossom pink decorative member according to [1], wherein the aforementioned decorative coating further comprises an adjustment layer and is formed by layering the undercoat layer, the adjustment layer, and the finishing layer from the base side, and the adjustment layer has a layer structure in which a Au alloy layer composed of an alloy containing Au, Pd, and Cu, and a carbonitride layer composed of a carbonitride of a metal containing Ti and at least one selected from Nb and Ta are alternately layered.

Providing the adjustment layer allows the color tone of the decorative member to be a more preferable cherry blossom pink color and can improve the scratch resistance.

[3] The cherry blossom pink decorative member according to [2], wherein the aforementioned adjustment layer has a layer structure in which a unit of one Au alloy layer and one carbonitride layer is repeated once or twice.

It is preferable that the number of repetitions of the aforementioned unit fall within the aforementioned range in view of the color tone and the productivity.

[4] The cherry blossom pink decorative member according to [1], wherein the aforementioned decorative coating further comprises a hardening layer and is formed by layering the hardening layer, the undercoat layer, and the finishing layer from the base side, and the hardening layer is a nitride layer composed of a nitride of a metal containing Ti and at least one selected from Nb and Ta.

Providing the hardening layer can further improve the scratch resistance of the decorative member.

[5] The cherry blossom pink decorative member according to [4], wherein the aforementioned decorative coating further comprises an adhesion layer and is formed by layering the adhesion layer, the hardening layer, the undercoat layer, and the finishing layer from the base side, and the adhesion layer is a Ti alloy layer composed of a metal containing Ti and at least one selected from Nb and Ta.

[6] The cherry blossom pink decorative member according to [4], wherein the aforementioned decorative coating further comprises an adhesion layer and is formed by layering the adhesion layer, the hardening layer, the undercoat layer, and the finishing layer from the base side, and the adhesion layer is a Ti layer composed of Ti and optionally containing oxygen.

Providing the adhesion layer can further improve the scratch resistance of the decorative member.

[7] The cherry blossom pink decorative member according to [5] or [6], wherein the aforementioned decorative coating further comprises a gradient layer and is formed by layering the adhesion layer, the gradient layer, the hardening layer, the undercoat layer, and the finishing layer from the base side, the gradient layer is a nitride layer composed of a nitride of a metal containing Ti and at least one selected from Nb and Ta, and the amount of nitrogen in the nitride increases as the distance from the base increases in the thickness direction of the decorative coating.

Providing the gradient layer can further improve the scratch resistance of the decorative member and can suppress the occurrence of cracks and the interlayer separation.

[8] The cherry blossom pink decorative member according to [7], wherein the aforementioned decorative coating further comprises an undercoat gradient layer and is formed by layering the adhesion layer, the gradient layer, the hardening layer, the undercoat gradient layer, the undercoat layer, and the finishing layer from the base side, the undercoat gradient layer is a carbonitride layer composed of a carbonitride of a metal containing Ti and at least one selected from Nb and Ta, the amount of nitrogen in the carbonitride decreases as the distance from the base increases in the thickness direction of the decorative coating, and the amount of carbon in the carbonitride increases as the distance from the base increases in the thickness direction of the decorative coating.

Providing the undercoat gradient layer can further improve the scratch resistance of the decorative member.

[9] The cherry blossom pink decorative member according to any one of [1] to [8], wherein 22 to 66 mass % in total of the at least one selected from Nb and Ta, 20 to 50 mass % of Ti, 7 to 19 mass % of nitrogen, and 4 to 15 mass % of carbon are contained in the aforementioned undercoat layer, assuming that the total amount of nitrogen, carbon, and the metal composed of Ti and the at least one selected from Nb and Ta is 100 mass %.

It is preferable that the amounts of the aforementioned elements fall within the aforementioned ranges in view of the color tone and the film hardness.

[10] The cherry blossom pink decorative member according to any one of [1] to [9], wherein the aforementioned finishing layer is a Au alloy layer composed of an alloy containing Au, Pd, and Cu, and 62 to 90 mass % of Au, 2.5 to 17 mass % of Pd, and 5 to 21 mass % of Cu are contained in the aforementioned finishing layer, assuming that the total amount of Au, Pd, and Cu is 100 mass %.

It is preferable that the amounts of the aforementioned elements fall within the aforementioned ranges in view of the color tone.

[11] The cherry blossom pink decorative member according to [2] or [3], wherein 62 to 90 mass % of Au, 2.5 to 17 mass % of Pd, and 5 to 21 mass % of Cu are contained in the Au alloy layer of the adjustment layer, assuming that the total amount of Au, Pd, and Cu is 100 mass %.

It is preferable that the amounts of the aforementioned elements fall within the aforementioned ranges in view of the color tone.

[12] The cherry blossom pink decorative member according to [2] or [3], wherein 22 to 66 mass % in total of the at least one selected from Nb and Ta, 20 to 50 mass % of Ti, 7 to 19 mass % of nitrogen, and 4 to 15 mass % of carbon are contained in the carbonitride layer of the adjustment layer, assuming that the total amount of nitrogen, carbon, and the metal composed of Ti and the at least one selected from Nb and Ta is 100 mass %.

It is preferable that the amounts of the aforementioned elements fall within the aforementioned ranges in view of the color tone and the film hardness.

[13] The cherry blossom pink decorative member according to [5], wherein 25 to 75 mass % in total of the at least one selected from Nb and Ta and 25 to 75 mass % of Ti are contained in the aforementioned adhesion layer, assuming that the total amount of Ti and the at least one selected from Nb and Ta is 100 mass %.

It is preferable that the amounts of the aforementioned elements fall within the aforementioned ranges in view of the adhesion.

[14] The cherry blossom pink decorative member according to any one of [1] to [13], wherein the thickness of the aforementioned decorative coating is 0.3 to 3.0 μm.

It is preferable that the thickness of the decorative coating fall within the aforementioned range in view of the scratch resistance and the abrasion resistance.

[15] The cherry blossom pink decorative member according to any one of [1] to [14], wherein is 80 or more, a* is 4 to 10, and b* is 9.5 to 16 in the L*a*b* color system, and h is 55° to 67° in the L*C*h color system.

When the aforementioned values fall within the aforementioned ranges, the decorative member exhibits a more preferable cherry blossom pink color.

[16] The cherry blossom pink decorative member according to any one of [1] to [15], wherein the aforementioned metal having a silver color is at least one selected from Pd, Pt, and Rh.

[17] The cherry blossom pink decorative member according to any one of [1] to [16], wherein the aforementioned finishing layer is a Au alloy layer composed of an alloy containing Au, Pd, and Cu.
[18] The cherry blossom pink decorative member according to any one of [1] to [17], wherein a peak corresponding to the plane and/or the [211] plane is observed in a diffraction pattern obtained by the X-ray diffraction measurement of the aforementioned finishing layer.
[19] A method for producing a cherry blossom pink decorative member that comprises a base and a decorative coating formed on the base, wherein the decorative coating is formed by layering an undercoat layer and a finishing layer from the base side, the method comprising: an undercoat layer layering step of layering the undercoat layer that is a carbonitride layer composed of a carbonitride of a metal containing Ti and at least one selected from Nb and Ta on the base; and a finishing layer layering step of layering the finishing layer that is a Au alloy layer composed of an alloy containing Au, a metal having a silver color, and Cu on the base on which the undercoat layer has been layered.
According to the aforementioned production method, a cherry blossom pink decorative member can be produced.
[20] The method for producing a cherry blossom pink decorative member according to [19], wherein the aforementioned metal having a silver color is at least one selected from Pd, Pt, and Rh.
[21] The method for producing a cherry blossom pink decorative member according to [19] or [20], wherein the aforementioned finishing layer is a Au alloy layer composed of an alloy containing Au, Pd, and Cu.
[22] The method for producing a cherry blossom pink decorative member according to any one of [19] to [21], further comprising a step of subjecting the aforementioned decorative member to annealing treatment.
[23] The method for producing a cherry blossom pink decorative member according to [22], wherein the aforementioned annealing treatment temperature is 200 to 500° C.

EXAMPLES

Example 1

A sintered body of an alloy composition containing 50 mass % of Ti and 50 mass % of Nb and a sintered body containing 73 mass % of Au, 4 mass % of Pd, and 23 mass % Cu were used as sputtering targets. As shown in FIG. 1, using a JIS type 2 Ti material as a base 11, a 0.25-μm NbTi alloy carbonitride film was formed on the base 11 by a sputtering method with 52 sccm of nitrogen gas and 57 sccm of $CH_4$ gas being introduced into 95 sccm of argon gas, to form an undercoat layer 12. Further, a 0.06-μm finishing layer 13 composed of AuPdCu was formed on the undercoat layer 12 with 180 sccm of Ar being introduced, to produce a cherry blossom pink decorative member 10. The undercoat layer 12 had a color tone with L*: 70.77, a*: 7.22, b*: 12.11, and h: 59.20, and the decorative member 10 had a color tone with L*: 84.15, a*: 6.16, b*: 10.32, and h: 59.17, so that a cherry blossom pink color was shown.

If the finishing layer 13 is formed directly on the base 11, the AuPdCu layer constituting the finishing layer 13 is very soft, and thus the Ti color tone (L*: 79.92, a*: 1.04, b*: 3.58, and h: 73.8) of the base 11 appears when the film separates due to abrasion, thereby allowing the appearance color to be gray. Therefore, use as a product is impossible.

Inserting the undercoat layer 12 having the same color tone as the finishing layer 13 as in the decorative member 10 causes almost no inconsistency, even if the finishing layer 13 separates, and further the presence of the undercoat layer 12 that is sufficiently harder than the base 11 contributes also to being resistant to scratches and making the finishing layer 13 less likely to separate.

Table 1 shows the measurement results of the color tone, the film hardness, and the scratch resistance of the materials constituting the decorative member 10. The film hardness when the undercoat layer 12 was not formed was 150 HV and was remarkably low as compared with 681 of the hardness of the decorative member 10. Because the scratch resistance performance is generally determined by the product of the film hardness, the film thickness, the degree of adhesion to the base, and the hardness of the base, the scratch resistance performance when the undercoat layer was not formed remarkably decreases, and further the finishing layer falls off earlier.

The film configuration as in the decorative member 10 increases the overall hardness of the decorative member and improves the scratch resistance and the abrasion resistance, and adjusting the undercoat layer to have the same color as the finishing layer enables the appearance in which inconsistency is suppressed as a product to be maintained, even if the finishing layer falls off.

From Table 3 which will be described below, it is inferred that the amounts of Nb, Ti, N, and C in the undercoat layer 12 fall within the preferable ranges described above.

TABLE 1

Color tone, hardness, and scratch resistance of materials constituting decorative member 10

| Sample | Color tone | | | | Hardness | Scratch resistance |
| --- | --- | --- | --- | --- | --- | --- |
| | L* | a* | b* | h | HV | Rq (Å) |
| Base 11 | 79.92 | 1.04 | 3.58 | 73.80 | 200 | — |
| Undercoat layer 12 | 70.77 | 7.22 | 12.11 | 59.20 | 1714 | — |
| Finishing layer 13 | 85.84 | 6.31 | 10.57 | 59.18 | 150 | — |
| Decorative member 10 | 84.15 | 6.16 | 10.32 | 59.17 | 681 | 2055 |

Example 2

A sintered body of an alloy composition containing 50 mass % of Ti and 50 mass % of Ta and a sintered body containing 73 mass % of Au, 4 mass % of Pd, and 23 mass % of Cu were used as sputtering targets. As shown in FIG. 2, using a JIS type 2 Ti material as a base 21, a 0.25-μm TaTi alloy carbonitride film was formed on the base 21 by a sputtering method with 54 sccm of nitrogen gas and 58 sccm of $CH_4$ gas being introduced into 95 sccm of argon gas, to form an undercoat layer 22. Further, a 0.06-μm finishing layer 23 composed of AuPdCu was formed on the undercoat layer 22 with 180 sccm of Ar being introduced, to produce a cherry blossom pink decorative member 20. The undercoat layer 22 had a color tone with L*: 70.41, a*: 6.98, b*: 12.18, and h: 60.18, and the decorative member 20 had a color tone with L*: 84.49, a*: 6.19, b*: 10.29, and h: 58.97, so that a cherry blossom pink color was shown.

If the finishing layer 23 is formed directly on the base 21, the AuPdCu layer constituting the finishing layer 23 is very soft, and thus the Ti color tone (L*: 79.92, a*: 1.04, b*: 3.58, and h: 73.8) of the base 21 appears when the film separates due to abrasion, thereby allowing the appearance color to be gray. Therefore, use as a product is impossible.

Inserting the undercoat layer 22 having the same color tone as the finishing layer 23 as in the decorative member 20 causes almost no inconsistency, even if the finishing layer 23 separates, and further the presence of the undercoat layer 22 that is sufficiently harder than the base 21 contributes also to being resistant to scratches and making the finishing layer 23 less likely to separate.

Table 2 shows the measurement results of the color tone, the film hardness, and the scratch resistance of the materials constituting the decorative member 20. The film hardness when the undercoat layer 22 was not formed was 150 HV and was remarkably low as compared with 745 of the hardness of the decorative member 20. Because the scratch resistance performance is generally determined by the product of the film hardness, the film thickness, the degree of adhesion to the base, and the hardness of the base, the scratch resistance performance when the undercoat layer was not formed remarkably decreases, and further the finishing layer falls off earlier.

The film configuration as in the decorative member 20 increases the overall hardness of the decorative member and improves the scratch resistance and the abrasion resistance, and adjusting the undercoat layer to have the same color as the finishing layer enables the appearance with almost no inconsistency as a product to be maintained, even if the finishing layer falls off.

If Nb in the alloy of the undercoat layer is changed to Ta, the film hardness increases because a Ta metal has a larger atomic weight than Nb, thereby enabling an increase in scratch resistance and abrasion resistance.

Table 3 shows the target composition ratio and the film composition ratio of the undercoat layer constituting the cherry blossom pink decorative member, and Table 4 shows those of the finishing layer constituting the cherry blossom pink decorative member. When h falls within the range of 55° to 67°, a* falls within the range of 4 to 10, and b* falls within the range of 9.5 to 16, in the material configuration used in Table 3 and Table 4, a cherry blossom pink color can be achieved.

In the composition ratio of AuCuPd shown in Table 4, a gold color is dominant at a ratio with Au being main, a reddish-brown color is dominant at a ratio with Cu being main, and a pink color is achieved by adjusting Au and Cu in a balanced manner. The pink color is lightened by mixing Pd, Pt, or Rh showing a silver color with AuCu showing the pink color, thereby enabling the production of a material showing a cherry blossom pink color.

Cu of the AuCu alloy constituting the pink color has a low corrosion resistance and is susceptible to discoloration (oxidation) or decoloration in an actual use environment. It turned out from the studies by the inventors that such discoloration can be suppressed by containing Pd. The use of Pd for producing a pale cherry blossom pink color in this example aims at the discoloration prevention function.

TABLE 2

Color tone, hardness, and scratch resistance of materials constituting decorative member 20

| Sample | Color tone | | | | Hardness | Scratch resistance |
| --- | --- | --- | --- | --- | --- | --- |
| | L* | a* | b* | h | HV | Rq (Å) |
| Base 21 | 79.92 | 1.04 | 3.58 | 73.80 | 200 | — |
| Undercoat layer 22 | 70.41 | 6.98 | 12.18 | 60.18 | 1826 | — |
| Finishing layer 23 | 85.84 | 6.31 | 10.57 | 59.18 | 150 | — |
| Decorative member 20 | 84.49 | 6.19 | 10.29 | 58.97 | 745 | 1928 |

TABLE 3

Material composition ratio of undercoat layer constituting decorative member

| Target composition (mass %) | | Gas conditions (sccm) | | Color tone | | | | Concentration in film (mass %) | | | |
| --- | --- | --- | --- | --- | --- | --- | --- | --- | --- | --- | --- |
| Nb | Ti | N2 | CH4 | L* | a* | b* | h | Nb | Ti | N | C |
| 25 | 75 | 48 | 58 | 72.61 | 6.81 | 15.89 | 66.80 | 22.4 | 49.3 | 18.8 | 9.5 |
| 25 | 75 | 48 | 62 | 68.88 | 8.15 | 11.75 | 55.25 | 24.1 | 45.1 | 16.3 | 14.5 |
| 50 | 50 | 52 | 54 | 72.95 | 6.11 | 14.37 | 66.95 | 38.0 | 37.8 | 16.1 | 8.1 |
| 50 | 50 | 52 | 54.5 | 72.60 | 6.35 | 14.39 | 66.19 | — | — | — | — |
| 50 | 50 | 52 | 55 | 72.16 | 6.55 | 14.21 | 65.25 | — | — | — | — |
| 50 | 50 | 52 | 55.5 | 71.94 | 6.77 | 14.21 | 64.53 | — | — | — | — |
| 50 | 50 | 52 | 56 | 71.76 | 6.94 | 13.59 | 62.93 | — | — | — | — |
| 50 | 50 | 52 | 56.5 | 71.35 | 7.11 | 13.44 | 62.12 | — | — | — | — |
| 50 | 50 | 52 | 57 | 70.77 | 7.22 | 12.11 | 59.20 | — | — | — | — |
| 50 | 50 | 52 | 57.5 | 70.67 | 7.24 | 11.90 | 58.69 | — | — | — | — |
| 50 | 50 | 52 | 58 | 69.18 | 7.34 | 10.68 | 55.48 | 38.2 | 37.6 | 14.2 | 10.0 |
| 75 | 25 | 59 | 46 | 73.12 | 5.40 | 12.58 | 66.77 | 65.3 | 20.1 | 10.2 | 4.4 |
| 75 | 25 | 59 | 52 | 70.35 | 6.99 | 10.29 | 55.81 | 63.3 | 22.8 | 7.8 | 6.1 |

| Target composition (mass %) | | Gas conditions (sccm) | | Color tone | | | | Concentration in film (mass %) | | | |
| --- | --- | --- | --- | --- | --- | --- | --- | --- | --- | --- | --- |
| Ta | Ti | N2 | CH4 | L* | a* | b* | h | Ta | Ti | N | C |
| 50 | 50 | 54 | 58 | 70.41 | 6.98 | 12.18 | 60.18 | 32.3 | 40.5 | 17.2 | 10 |

TABLE 4

Material composition ratio of finishing layer constituting decorative member

| Target wt % | | | Color tone | | | | wt % (conversion) in film | | | Concentration in film (at %) | | | Color tone determination |
|---|---|---|---|---|---|---|---|---|---|---|---|---|---|
| Au | Cu | Pd | L* | a* | b* | h | Au | Cu | Pd | Au | Cu | Pd | |
| 83.7 | 15.6 | 0.7 | 86.40 | 11.09 | 16.41 | 55.95 | 89.82 | 8.89 | 1.29 | 75 | 23 | 2 | NG |
| 81 | 17.5 | 1.5 | 86.80 | 9.20 | 13.80 | 56.31 | 87.41 | 9.93 | 2.66 | 71 | 25 | 4 | OK |
| 80 | 16 | 4 | 86.38 | 7.20 | 11.82 | 58.65 | 79.91 | 12.89 | 7.20 | 60 | 30 | 10 | OK |
| 73 | 23 | 4 | 85.84 | 6.31 | 10.57 | 59.18 | 73.2 | 18.9 | 7.9 | 50 | 40 | 10 | OK |
| 83 | 13.5 | 3.5 | 85.25 | 7.23 | 13.60 | 62.00 | 87.98 | 5.68 | 6.34 | 75 | 15 | 10 | OK |
| 81.7 | 15 | 3.3 | 86.90 | 9.80 | 15.00 | 56.84 | 89.82 | 5.20 | 4.98 | 78 | 14 | 8 | OK |
| 62 | 30 | 8 | 83.99 | 4.9 | 9.5 | 62.72 | 62.8 | 20.3 | 17.0 | 50 | 30 | 20 | OK |

In the color tone determination, "OK" indicates that a film has a preferable cherry blossom pink color, and "NG" indicates that a film does not have a preferable cherry blossom pink color.

Example 3

A sintered body of an alloy composition containing 50 mass % of Ti and 50 mass % of Nb and a sintered body containing 80 mass % of Au, 4 mass % of Pd, and 16 mass % of Cu were used as sputtering targets. As shown in FIG. 3, using a JIS type 2 Ti material as a base 31, a 1.0-μm NbTi alloy carbonitride film was formed on the base 31 by a sputtering method with 52 sccm of nitrogen gas and 57 sccm of CH₄ gas being introduced into 95 sccm of argon gas, to form an undercoat layer 32. Further, a 0.06-μm finishing layer 33 composed of AuPdCu was formed on the undercoat layer 32 with 180 sccm of Ar being introduced, to produce a cherry blossom pink decorative member 30. The undercoat layer 32 had a color tone with L*: 70.97, a*: 7.17, b*: 12.42, and h: 60.0, and the decorative member 30 had a color tone with L*: 84.8, a*: 7.19, b*: 13.12, and h: 58.65, so that a cherry blossom pink color was shown.

If the finishing layer 33 is formed directly on the base 31, the AuPdCu layer constituting the finishing layer 33 is very soft, and thus the Ti color tone (L*: 79.92, a*: 1.04, b*: 3.58, and h: 73.8) of the base 31 appears when the film separates due to abrasion, thereby allowing the appearance color to be gray. Therefore, use as a product is impossible.

Inserting the undercoat layer 32 having the same color tone as the finishing layer 33 as in the decorative member 30 causes almost no inconsistency, even if the finishing layer 33 separates, and further the presence of the undercoat layer 32 that is sufficiently harder than the base 31 contributes also to being resistant to scratches and making the finishing layer 33 less likely to separate.

Table 5 shows the measurement results of the color tone, the film hardness, and the scratch resistance of the materials constituting the decorative member 30. The film hardness when the undercoat layer 32 was not formed was 179 HV and was remarkably low as compared with 898 of the hardness of the decorative member 30. Because the scratch resistance performance is generally determined by the product of the film hardness, the film thickness, the degree of adhesion to the base, and the hardness of the base, the scratch resistance performance when the undercoat layer was not formed remarkably decreases, and further the finishing layer falls off earlier.

Forming the undercoat layer 32 of the decorative member 30 to have a large film thickness of 1.0 μm in the same manner increases the overall hardness (composite hardness) of the member, as a result of which the scratch resistance performance is doubled as compared with the result for the decorative member 10 in Table 1.

The film configuration as in the decorative member 30 increases the overall hardness of the decorative member and improves the scratch resistance and the abrasion resistance, and adjusting the undercoat layer to have the same color as the finishing layer enables the appearance with almost no inconsistency as a product to be maintained, even if the finishing layer falls off.

When consideration is given to the scratch resistance, the film thickness of the finishing layer 33 forming the decorative member 30 is preferably as thin as possible. The AuPdCu film constituting the finishing layer 33 has a very low hardness and is susceptible to scratches and abrasion, as mentioned above. Therefore, in order to allow every member to show a cherry blossom pink color, the film thickness is optimally in the range of 0.02 to 0.1 μm. When the film is thinner than 0.02 μm, sufficient color development is not obtained. Conversely, even if a film of 0.1 μm or more is formed, there is no change in color tone, but the increase in the film thickness of the AuPdCu film that has a low hardness reduces the scratch resistance and further increases the production cost.

TABLE 5

Color tone, hardness, and scratch resistance of materials constituting decorative member 30

| Sample | Color tone | | | | Hardness | Scratch resistance |
|---|---|---|---|---|---|---|
| | L* | a* | b* | h | HV | Rq (Å) |
| Base 31 | 79.92 | 1.04 | 3.58 | 73.80 | 200 | — |
| Undercoat layer 32 | 70.97 | 7.17 | 12.42 | 60.00 | 1714 | — |
| Finishing layer 33 | 86.38 | 7.20 | 11.82 | 58.65 | 179 | — |
| Decorative member 30 | 84.8 | 7.19 | 13.12 | 58.65 | 898 | 1387 |

Example 4

A sintered body of an alloy composition containing 50 mass % of Ti and 50 mass % of Nb and a sintered body containing 73 mass % of Au, 4 mass % of Pd, and 23 mass % of Cu were used as sputtering targets. As shown in FIG. 4, using a JIS type 2 Ti material as a base 41, a 1.0-μm NbTi alloy carbonitride film was formed on the base 41 by a sputtering method with 52 sccm of nitrogen gas and 57 sccm of CH₄ gas being introduced into 95 sccm of argon gas, to form an undercoat layer 42. Further, a 0.01-μm film composed of AuPdCu with 180 sccm of Ar being introduced and a 0.01-μm film formed under the same conditions as the undercoat layer 42 were layered on the undercoat layer 42, to form an adjustment layer 43. Further, a 0.05-μm finishing layer 44 composed of a AuPdCu film (film obtained under the same conditions as the film composed of AuPdCu of the adjustment layer 43) was formed on the adjustment layer 43, to produce a cherry blossom pink decorative member 40. The undercoat layer 42 had a color tone with L*: 70.97, a*: 7.17, b*: 12.42, and h: 60.0, the adjustment layer 43 had a color tone with L*: 72.66, a*: 6.88, b*: 12.78, and h: 61.70, and the decorative member 50 had a color tone with L*: 84.75, a*: 6.28, b*: 10.68, and h: 59.54, so that a cherry blossom pink color was shown (Table 7).

If the adjustment layer 43 is introduced onto the undercoat layer 42, the brightness (L*) of the undercoat layer increases due to the layering effect of the AuPdCu film, and therefore the difference in color tone from the finishing layer further decreases. Further, layering a NbTiNC layer having a high hardness allows deep scratches to be stopped by the NbTiNC layer and therefore contributes also to improving the scratch resistance.

The film thickness of each of the AuPdCu film and the NbTiNC film to be layered is desirably about 0.005 to 0.016 μm. When the film thickness is less than 0.005 μm, the scratch reduction effect by the NbTiNC film may possibly be lost. When the film thickness is larger than 0.016 μm, the color deepening effect by layering may possibly be lost, resulting in the same color tone as the undercoat layer 42.

The number of layering the adjustment layer 43 is desirably once or twice. Table 6 and FIG. 5 show the results of changes in color tone depending on the number of layering. When the number of layering is more than twice, the brightness (L*) increases with the number of layering, but the hue angle (h) also increases in the same manner, and therefore the base color of the cherry blossom pink color that has been especially adjusted is lost. Further, as the number of layering increases, the process time also increases, and therefore the number of layering is desirably within twice.

Table 7 shows the measurement results of the color tone, the film hardness, and the scratch resistance of the materials constituting the decorative member 40. As compared with Table 5 in Example 3, it is understood that the Rq (Å) value that indicates the scratch resistance performance decreases.

Introducing an adjustment layer as in the decorative member 40 can reduce the difference in color tone (inconsistency) in the case of separation of the finishing layer, and layering the NbTiNC film can make deep scratches less likely to occur, thereby achieving improvement in the scratch resistance.

TABLE 6

The number of layering adjustment layer

|  |  | L* | a* | b* | h |
|---|---|---|---|---|---|
| Undercoat layer |  | 70.97 | 7.17 | 12.42 | 60.00 |
| Adjustment layer | Layering once | 72.66 | 6.88 | 12.78 | 61.70 |
|  | Layering twice | 76.06 | 5.48 | 12.86 | 66.93 |
|  | Layering three times | 78.11 | 4.87 | 13.54 | 70.22 |
| Finishing layer |  | 85.84 | 6.31 | 10.57 | 59.18 |

TABLE 7

Color tone, hardness, and scratch resistance of materials constituting decorative member 40

| Sample | Color tone | | | | Hardness | Scratch resistance |
|---|---|---|---|---|---|---|
|  | L* | a* | b* | h | HV | Rq (Å) |
| Base 41 | 79.92 | 1.04 | 3.58 | 73.80 | 200 | — |
| Undercoat layer 42 | 70.97 | 7.17 | 12.42 | 60.00 | 1714 | — |
| Adjustment layer 43 | 72.66 | 6.88 | 12.78 | 61.70 | — | — |
| Finishing layer 44 | 85.84 | 6.31 | 10.57 | 59.18 | 150 | — |
| Decorative member 40 | 84.75 | 6.28 | 10.68 | 59.54 | 1050 | 1231 |

Example 5

A sintered body of an alloy composition containing 30 mass % of Ti and 70 mass % of Nb and a sintered body containing 83 mass % of Au, 3.5 mass % of Pd, and 13.5 mass % of Cu were used as sputtering targets. As shown in FIG. 6, using a JIS type 2 Ti material as a base 51, a 0.7-μm hardening layer 52 composed of a NbTiN film was formed on the base 51 by a sputtering method with 100 sccm of nitrogen gas being introduced in addition to 95 sccm of argon gas. Subsequently, a 0.3-μm NbTi alloy carbonitride film was formed on the hardening layer 52 with 58 sccm of nitrogen gas and 48 sccm of CH$_4$ gas being introduced in addition to 95 sccm of argon gas, to form an undercoat layer 53. Further, a 0.01-μm film composed of AuPdCu with 180 sccm of Ar being introduced and a 0.01-μm film formed under the same conditions as the undercoat layer 53 were layered on the undercoat layer 53, to form an adjustment layer 54. Further, a 0.05-μm finishing layer 55 composed of a AuPdCu film (film obtained under the same conditions as the film composed of AuPdCu of the adjustment layer 54) was formed on the adjustment layer 54, to produce a cherry blossom pink decorative member 50. The undercoat layer 53 had a color tone with L*: 71.23, a*: 6.59, b*: 11.89, and h: 61.0, the adjustment layer 54 had a color tone with L*: 73.51, a*: 6.35, b*: 12.68, and h: 63.4, and the decorative member 50 had a color tone with L*: 85.01, a*: 7.16, b*: 13.79, and h: 62.56, so that a cherry blossom pink color was shown (Table 8).

Because the scratch resistance performance is generally determined by the product of the film hardness, the film thickness, the degree of adhesion to the base, and the hardness of the base, inserting the hardening layer 52 increases the overall hardness of the decorative member (composite hardness) and contributes to improving the scratch resistance. Further, increasing the ratio of Nb having a high hardness as compared with Ti increases the hardness of the NbTiN and NbTiNC films, thereby leading to further improvement in the scratch resistance.

The NbTiN film forming the hardening layer 52 varied depending on the amount of N$_2$ introduced, as shown in FIG. 7. The introduction condition of N$_2$ with the highest hardness is preferable.

It can be inferred from Table 3 that the amounts of Nb, Ti, N, and C in the carbonitride films of the undercoat layer 53 and the adjustment layer 54 were within the preferable ranges described above. Further, it also can be inferred that the amounts of Nb, Ti, and N in the hardening layer 52 were within the preferable ranges described above.

TABLE 8

Color tone, hardness, and scratch resistance of materials constituting decorative member 50

| Sample | Color tone | | | | Hardness | Scratch resistance |
| --- | --- | --- | --- | --- | --- | --- |
| | L* | a* | b* | h | HV | Rq (Å) |
| Base 51 | 79.92 | 1.04 | 3.58 | 73.80 | 200 | — |
| Hardening layer 52 | 81.83 | 1.42 | 18.01 | 85.49 | 2526 | — |
| Undercoat layer 53 | 71.23 | 6.59 | 11.89 | 61.00 | 1842 | — |
| Adjustment layer 54 | 73.51 | 6.35 | 12.68 | 63.40 | — | — |
| Finishing layer 55 | 85.25 | 7.23 | 13.60 | 62.00 | 168 | — |
| Decorative member 50 | 85.01 | 7.16 | 13.79 | 62.56 | 1240 | 921 |

Example 6

A sintered body of an alloy composition containing 30 mass % of Ti and 70 mass % of Nb and a sintered body containing 83 mass % of Au, 3.5 mass % of Pd, and 13.5 mass % of Cu were used as sputtering targets. As shown in FIG. 8, using a JIS type 2 Ti material as a base 61, a 0.1-μm adhesion layer 62 composed of a NbTi metal film was formed on the base 61 by a sputtering method with 95 sccm of argon gas being introduced. Subsequently, a 0.7-μm hardening layer 63 composed of a NbTiN film was formed with 100 sccm of nitrogen gas being introduced in addition to 95 sccm of argon gas. Subsequently, a 0.3-μm NbTi alloy carbonitride film was formed on the hardening layer 63 with 58 sccm of nitrogen gas and 48 sccm of $CH_4$ gas being introduced in addition to 95 sccm of argon gas, to form an undercoat layer 64. Further, a 0.01-μm film composed of AuPdCu with 180 sccm of Ar being introduced and a 0.01-μm film formed under the same conditions as the undercoat layer 64 were layered on the undercoat layer 64, to form an adjustment layer 65. Further, a 0.05-μm finishing layer 66 composed of a AuPdCu film (film obtained under the same conditions as the film composed of AuPdCu of the adjustment layer 65) was formed on the adjustment layer 65, to produce a cherry blossom pink decorative member 60. The undercoat layer 64 had a color tone with L*: 71.23, a*: 6.59, b*: 11.89, and h: 61.0, the adjustment layer 65 had a color tone with L*: 73.51, a*: 6.35, b*: 12.68, and h: 63.4, and the decorative member 60 had a color tone with L*: 84.89, a*: 7.10, b*: 13.54, and h: 62.33, so that a cherry blossom pink color was shown (Table 9).

Inserting the adhesion layer 62 remarkably improves the adhesion between the base and the film. The adhesion depends on the compatibility between the base and the metals constituting the film, and the stress (force directed away from the substrate) of the film to be formed. Metal films has overwhelmingly excellent adhesion onto metal bases, as compared with intermediate films between metals and ceramics such as nitrides and carbides. Further, the stress of films such as nitrides and carbides increases in proportion to an increase in hardness. Introducing an adhesion layer as in Example 6 can enhance the adhesion to the base.

Because the scratch resistance performance is generally determined by the product of the film hardness, the film thickness, the degree of adhesion to the base, and the hardness of the base, introducing the adhesion layer 62 can improve the scratch resistance.

TABLE 9

Color tone, hardness, and scratch resistance of materials constituting decorative member 60

| Sample | Color tone | | | | Hardness | Scratch resistance |
| --- | --- | --- | --- | --- | --- | --- |
| | L* | a* | b* | h | HV | Rq (Å) |
| Base 61 | 79.92 | 1.04 | 3.58 | 73.80 | 200 | — |
| Adhesion layer 62 | 77.78 | 1.09 | 2.4 | 65.57 | 411 | — |
| Hardening layer 63 | 81.83 | 1.42 | 18.01 | 85.49 | 2526 | — |
| Undercoat layer 64 | 71.23 | 6.59 | 11.89 | 61.00 | 1842 | — |
| Adjustment layer 65 | 73.51 | 6.35 | 12.68 | 63.40 | — | — |
| Finishing layer 66 | 85.25 | 7.23 | 13.60 | 62.00 | 168 | — |
| Decorative member 60 | 84.89 | 7.1 | 13.54 | 62.33 | 1234 | 735 |

Example 7

A sintered body of an alloy composition containing 30 mass % of Ti and 70 mass % of Nb, a sintered body containing 83 mass % of Au, 3.5 mass % of Pd, and 13.5 mass % of Cu, and Ti were used as sputtering targets. As shown in FIG. 9, using a SUS316L material defined in JIS as a base 71, a 0.1-μm adhesion layer 72 composed of a Ti metal film was formed on the base 71 by a sputtering method with 180 sccm of argon gas being introduced. Subsequently, a 0.7-μm hardening layer 73 composed of a NbTiN film was formed with 100 sccm of nitrogen gas being introduced in addition to 95 sccm of argon gas. Subsequently, a 0.3-μm NbTi alloy carbonitride film was formed on the hardening layer 73 with 58 sccm of nitrogen gas and 48 sccm of $CH_4$ gas being introduced in addition to 95 sccm of argon gas, to form an undercoat layer 74. Further, a 0.01-μm film composed of AuPdCu with 180 sccm of Ar being introduced and a 0.01-μm film formed under the same conditions as the undercoat layer 74 were layered on the undercoat layer 74, to form an adjustment layer 75. Further, a 0.05-μm finishing layer 76 composed of a AuPdCu film (film obtained under the same conditions as the film composed of AuPdCu of the adjustment layer 75) was formed on the adjustment layer 75, to produce a cherry blossom pink decorative member 70. The undercoat layer 74 had a color tone with L*: 71.23, a*: 6.59, b*: 11.89, and h: 61.0, the adjustment layer 75 had a color tone with L*: 73.51, a*: 6.35, b*: 12.68, and h: 63.4, and the decorative member 70 had a color tone with L*: 85.01, a*: 7.2, b*: 13.66, and h: 62.21, so that a cherry blossom pink color was shown (Table 10).

Inserting the Ti metal film into the adhesion layer 72 allows high adhesion also to the SUS316L material to be obtained and therefore can ensure high scratch resistance. The Ti metal film has good compatibility with various bases and exhibits high adhesion not only to the SUS316L material but also to SK materials (carbon tool steels), brasses, or the like. Further, introducing a certain amount of oxygen into the Ti metal film can further improve the adhesion.

FIG. 10 shows a change in scratch resistance (adhesion) when oxygen was introduced into the Ti metal film serving as the adhesion layer (that is, when only the adhesion layer of the decorative member 70 was changed). It is understood that the scratch resistance (adhesion) was improved by introducing oxygen and was drastically deteriorated when the amount exceeded a certain point. Assuming that the total amount of Ti and O with 10 sccm of oxygen being introduced was 100 mass %, Ti was 50 mass % and O was 50 mass %. When O exceeded 50 mass %, the adhesion decreased, and the scratch resistance also decreased. Therefore, the amount of oxygen to be introduced into the adhesion layer is optimally 0 to 50 mass %.

Although the reason why the introduction of oxygen improves the adhesion is not clear, it is inferred that excess unpaired electrons that have failed to be transformed into oxides serve as a glue bonding between the base and the adhesion layer and between the adhesion layer and the hardening layer.

TABLE 10

Color tone, hardness, and scratch resistance of materials constituting decorative member 70

| Sample | Color tone | | | | Hardness | Scratch resistance |
| --- | --- | --- | --- | --- | --- | --- |
| | L* | a* | b* | h | HV | Rq (Å) |
| Base 71 | 85.15 | 0.36 | 2.46 | 81.67 | 250 | — |
| Adhesion layer 72 | 78.89 | 0.99 | 3.98 | 76.03 | 300 | — |
| Hardening layer 73 | 81.83 | 1.42 | 18.01 | 85.49 | 2526 | — |
| Undercoat layer 74 | 71.23 | 6.59 | 11.89 | 61.00 | 1842 | — |
| Adjustment layer 75 | 73.51 | 6.35 | 12.68 | 63.40 | — | — |
| Finishing layer 76 | 85.25 | 7.23 | 13.60 | 62.00 | 168 | — |
| Decorative member 70 | 85.01 | 7.2 | 13.66 | 62.21 | 1215 | 711 |

Example 8

A sintered body of an alloy composition containing 30 mass % of Ti and 70 mass % of Nb and a sintered body containing 83 mass % of Au, 3.5 mass % of Pd, and 13.5 mass % of Cu were used as sputtering targets. As shown in FIG. 11, using a JIS type 2 Ti material as a base 81, a 0.1-μm adhesion layer 82 composed of a NbTi metal film was formed on the base 81 by a sputtering method with 95 sccm of argon gas being introduced. Subsequently, a 0.1-μm gradient layer 83 of a NbTiN film was formed with nitrogen gas being gradually increased from 0 to 100 sccm, in addition to 95 sccm of argon gas. Subsequently, a 0.7-μm hardening layer 84 composed of NbTiN was formed with 100 sccm of nitrogen gas being introduced in addition to 95 sccm of argon gas. Subsequently, a 0.3-μm NbTi alloy carbonitride film was formed on the hardening layer 84 with 58 sccm of nitrogen gas and 48 sccm of CH$_4$ gas being introduced in addition to 95 sccm of argon gas, to form an undercoat layer 85. Further, a 0.01-μm film composed of AuPdCu with 180 sccm of Ar being introduced and a 0.01-μm film formed under the same conditions as the undercoat layer 85 were layered on the undercoat layer 85, to form an adjustment layer 86. Further, a 0.05-μm finishing layer 87 composed of a AuPdCu film (film obtained under the same conditions as the film composed of AuPdCu of the adjustment layer 86) was formed on the adjustment layer 86, to produce a cherry blossom pink decorative member 80. The undercoat layer 85 had a color tone with L*: 71.23, a*: 6.59, b*: 11.89, and h: 61.0, the adjustment layer 86 had a color tone with L*: 73.51, a*: 6.35, b*: 12.68, and h: 63.4, and the decorative member 80 had a color tone with L*: 85.31, a*: 7.33, b*: 13.79, and h: 62.01, so that a cherry blossom pink color was shown (Table 11).

Inserting the gradient layer 83 dramatically mitigates the difference in film stress between the adhesion layer and the hardening layer, to improve the overall adhesion of the decorative member, thereby improving the scratch resistance. The mitigation of the stress difference can reduce cracks and can dramatically improve defects such as interlayer separation in long-term use. Further, such a structure as in the decorative member 80 enables an increase in the film thickness of the hardening layer to any extent. Therefore, for example, even if the thickness of the hardening layer is increased to 2.5 μm so that the total thickness is 3.0 μm, neither film separation nor cracks occur, and the scratch resistance can be improved because the overall composite hardness of the decorative member increases. However, if the total thickness is increased more than above, the hardness of the AuPdCu layer serving as the finishing layer is limited, and the scratch resistance plateaus. Therefore, the total thickness is desirably up to about 3.0 μm.

TABLE 11

Color tone, hardness, and scratch resistance of materials constituting decorative member 80

| Sample | Color tone | | | | Hardness | Scratch resistance |
| --- | --- | --- | --- | --- | --- | --- |
| | L* | a* | b* | h | HV | Rq (Å) |
| Base 81 | 79.92 | 1.04 | 3.58 | 73.80 | 200 | — |
| Adhesion layer 82 | 77.78 | 1.09 | 2.4 | 65.57 | 411 | — |
| Gradient layer 83 | — | — | — | — | — | — |
| Hardening layer 84 | 81.83 | 1.42 | 18.01 | 85.49 | 2526 | — |
| Undercoat layer 85 | 71.23 | 6.59 | 11.89 | 61.00 | 1842 | — |
| Adjustment layer 86 | 73.51 | 6.35 | 12.68 | 63.40 | — | — |
| Finishing layer 87 | 85.25 | 7.23 | 13.60 | 62.00 | 168 | — |
| Decorative member 80 | 85.31 | 7.33 | 13.79 | 62.01 | 1236 | 609 |

Example 9

Example 9 is the most optimal structure of the cherry blossom pink decorative member according to the present invention. A sintered body of an alloy composition containing 50 mass % of Ti and 50 mass % of Nb and a sintered body containing 73 mass % of Au, 4 mass % of Pd, and 23 mass % of Cu were used as sputtering targets. As shown in FIG. 12, using a JIS type 2 Ti material as a base 91, a 0.1-μm adhesion layer 92 composed of a NbTi metal film was formed on the base 91 by a sputtering method with 95 sccm of argon gas being introduced. Subsequently, a 0.05-μm gradient layer 93 of a NbTiN film was formed with nitrogen gas being gradually increased from 0 to 100 sccm, in addition to 95 sccm of argon gas. Subsequently, a 0.65-μm hardening layer 94 composed of NbTiN was formed with 100 sccm of nitrogen gas being introduced in addition to 95 sccm of argon gas. Thereafter, a 0.03-μm undercoat gradient layer 95 formed with nitrogen gas being decreased from 100 sccm to 52 sccm and CH$_4$ gas being increased from 0 sccm to 57 sccm in addition to 95 sccm of argon gas was produced on the hardening layer 94. Thereafter, a 0.33-μm NbTi alloy carbonitride film was formed on the undercoat gradient layer 95 with 52 sccm of nitrogen gas and 57 sccm of CH$_4$ gas being introduced in addition to 95 sccm of argon gas, to form an undercoat layer 96. Further, a 0.01-μm film composed of AuPdCu with 180 sccm of Ar being introduced and a 0.01-μm film formed under the same gas conditions as the undercoat layer 96 were layered on the undercoat layer 96, to form an adjustment layer 97. Further, a 0.05-μm finishing layer 98 composed of a AuPdCu film (film obtained under the same conditions as the film composed of AuPdCu of the adjustment layer 97) was formed on the adjustment layer 97, to produce a cherry blossom pink decorative member 90. The undercoat layer 96 had a color tone with L*: 70.77, a*: 7.22, b*: 12.11, and h: 59.20, the adjustment layer 97 had a color tone with L*: 72.81, a*: 6.49, b*: 12.89, and h: 63.28, and the decorative member 90 had a color tone with L*: 85.16, a*: 6.38, b*: 11.20, and h: 60.33, so that a cherry blossom pink color was shown.

Introducing the undercoat gradient layer 95 as in the decorative member 90 mitigates the stress difference between the hardening layer and the undercoat layer and therefore improves the overall adhesion of the decorative member.

Such a structure as in the decorative member 90 enables an increase in the film thickness of the hardening layer to any extent. Therefore, for example, even if the thickness of the hardening layer is increased to 2.5 μm so that the total thickness is 3.0 μm, neither film separation nor cracks occur, and the scratch resistance can be improved because the overall composite hardness of the decorative member increases. However, if the total thickness is increased more than above, the hardness of the AuPdCu layer serving as the finishing layer is limited, and the scratch resistance plateaus. Therefore, the total thickness is desirably up to about 3.0 μm.

FIG. 13 shows a cross-sectional SEM image of the decorative member 90 produced in Example 9.

Further, FIG. 14 shows profiles of substrates after scratch resistance tests of the decorative member 10 fabricated in Example 1 and the decorative member 90. It is understood from FIG. 14 that the number of occurrence and the depth of scratches were obviously improved.

FIG. 15 shows the comparison of the scratch resistance of the decorative member 10 to the decorative member 90. It is understood that such a film configuration as in the decorative member 90 improves the scratch resistance.

It can be inferred from Table 3 that the amounts of Nb, Ti, and N in the hardening layer 94 were within the preferable ranges described above.

TABLE 12

Color tone, hardness, and scratch resistance of materials constituting decorative member 90

| Sample | Color tone | | | | Hardness | Scratch resistance |
| | L* | a* | b* | h | HV | Rq (Å) |
|---|---|---|---|---|---|---|
| Base 91 | 79.92 | 1.04 | 3.58 | 73.80 | 200 | — |
| Adhesion layer 92 | 77.78 | 1.09 | 2.4 | 65.57 | 398 | — |
| Gradient layer 93 | — | — | — | — | — | — |
| Hardening layer 94 | 81.86 | 1.64 | 19.24 | 85.13 | 2436 | — |

TABLE 12-continued

Color tone, hardness, and scratch resistance of materials constituting decorative member 90

| Sample | Color tone | | | | Hardness | Scratch resistance |
| | L* | a* | b* | h | HV | Rq (Å) |
|---|---|---|---|---|---|---|
| Undercoat gradient layer 95 | — | — | — | — | — | — |
| Undercoat layer 96 | 70.77 | 7.22 | 12.11 | 59.20 | 1714 | — |
| Adjustment layer 97 | 72.81 | 6.49 | 12.89 | 63.28 | — | — |
| Finishing layer 98 | 85.84 | 6.31 | 10.57 | 59.18 | 150 | — |
| Decorative member 90 | 85.16 | 6.38 | 11.2 | 60.33 | 1251 | 511 |

Comparative Example

Table 13 shows the measurement results of the color tone of a TiNC film in the case of using Ti instead of NbTi or TaTi. The TiNC film was produced by a sputtering method with 95 sccm of argon gas and 46 sccm of nitrogen gas being constant and a flow rate of a methane gas being varied. As the CH$_4$ gas increased, the color tone of the TiNC film changed from faint yellow to yellow, and when the CH$_4$ gas was 62 sccm, the film drastically changed to have a brown color. This is derived from the fact that the deposition state of the Ti material changes from a transition region mode to a compound mode when the amount of the reaction gas exceeds a certain amount in a sputtering method. When the state transfers to the compound mode, a compound film (TiNC film) that has sufficiently reacted deposits on the surface of the target, and the compound film is formed on the substrate. Therefore, no change occurs in color tone even if the gas conditions are changed (CH$_4$: 63 or 64 sccm). It is said that the change in the film forming mode is determined depending on the properties and the atomic weight of the film material, and the degree of vacuum during film formation, where the Ti material is a representative which undergoes such a change in film forming mode.

Preferable color tone conditions for showing a cherry blossom pink color are a* in the range of 4 to 10, b* in the range of 9.5 to 16, and h in the range of 55° to 67°, and as is obvious from the results of Table 13, the undercoat layer of the cherry blossom pink decorative member cannot be produced using the TiNC film.

TABLE 13

Measurement results of color tone of TiNC film

| N2 | CH4 | L* | a* | b* | h |
|---|---|---|---|---|---|
| 46 | 64 | 64.83 | 13.86 | 22.85 | 58.75 |
| 46 | 63 | 65.35 | 13.82 | 22.58 | 58.53 |
| 46 | 62 | 69.11 | 11.63 | 25.76 | 65.71 |
| 46 | 61 | 74.55 | 4.47 | 23.03 | 79.01 |
| 46 | 60 | 77.09 | 1.68 | 15.55 | 83.85 |
| 46 | 59 | 77.44 | 1.02 | 12.28 | 85.24 |
| 46 | 58 | 77.60 | 0.83 | 10.16 | 85.33 |

Production Examples

FIG. 16 shows comparison of crystallinity of a NbTi alloy nitride film with a TiN film and a NbN film. It is considered from FIG. 16 that the crystallinity of the TiNb alloy nitride film has a peak just at the middle position between the TiN film and the NbN film, and therefore an alloy crystal of a solid solution of Nb and Ti is formed.

Example 10

The cherry blossom pink decorative member 90 prepared in Example 9 was further subjected to vacuum heating (annealing treatment). The decorative member 90 was put into a vacuum heating furnace, followed by annealing treatment at 200° C. for one hour, annealing treatment at 300° C. for one hour, or annealing treatment at 400° C. for one hour, to prepare a decorative member 100.

Table 14 shows the results for the color tone, the hardness, and the scratch resistance of the decorative member 100 obtained under each annealing condition, together with comparison with the decorative member 90. It is understood from Table 14 that subjecting to annealing treatment can increase the brightness and the hardness and improve the scratch resistance.

TABLE 14

Comparison of color tone, hardness, and scratch resistance by annealing treatment

| Sample | Color tone | | | | Hardness | Scratch resistance |
| --- | --- | --- | --- | --- | --- | --- |
|  | L* | a* | b* | h | HV | Rq (Å) |
| Decorative member 90 | 85.16 | 6.38 | 11.2 | 60.33 | 1251 | 511 |
| Annealing at 200° C. | 85.33 | 6.28 | 10.9 | 60.05 | 1311 | 485 |
| Annealing at 300° C. | 85.68 | 6.11 | 10.2 | 59.08 | 1395 | 452 |
| Annealing at 400° C. | 84.57 | 6.78 | 11.5 | 59.48 | 1377 | 487 |

FIG. 17 shows the surface analysis results using an atomic force microscope for the decorative member 90 and the decorative member 100 that was subjected to annealing treatment at 300° C. The results for the decorative member 90 are shown on the left side, and the results for the decorative member 100 are shown on the right side. While the decorative member 90 had a surface roughness Ra of 3.75 Å, the decorative member 100 had a surface roughness Ra of 2.22 Å.

FIG. 18 shows the comparison of crystallinity by X-ray diffraction between the decorative member 90 and the decorative member 100 subjected to annealing treatment at 300° C. The results for the decorative member 90 are shown on the lower side, and the results for the decorative member 100 are shown on the upper side. Subjecting to annealing treatment improves the crystallinity of the alloy composed of AuPdCu uniformly, where the crystal size on the [111] plane with the highest intensity grows 41%. Further, because crystals on the [100] plane and the [211] plane that had not been observed before the annealing treatment were observed, it is considered that the crystallinity of AuPdCu was uniformly improved, and the hardness, the brightness, and the scratch resistance of the decorative member 100 were improved. The integrated intensity of peaks of the [100] plane with respect to that of the [111] plane was 7.9%, and the integrated intensity of peaks of the [211] plane with respect to that of the [111] plane was 2.3%.

It is considered from FIG. 17 and FIG. 18 that the film hardness increased due to the crystals of AuPdCu being more closely bound together by annealing treatment to form a regular lattice, and the brightness was improved because the surface roughness (Ra) decreased due to the crystals being more closely together and the scattering of light was reduced thereby.

In annealing treatment at 400° C., a slight white turbidity was observed on the surface of the decorative member, as compared with in annealing treatment at 300° C. It is inferred that this is because the regular lattice further grew larger by annealing treatment to enlarge the crystal grains, thereby increasing the surface roughness (Ra).

As described above, a cherry blossom pink decorative member having a higher brightness, a higher hardness, and a superior scratch resistance can be produced by subjecting to annealing treatment at a suitable temperature.

[Evaluation Method]

(Amounts of Elements)

The amounts of elements constituting each layer were measured by ESCA (Electron Spectroscopy for Chemical Analysis) and EPMA (Electron Probe Micro-Analyzer). In ESCA, the member was subjected to sputtering etching from the top surface and elements qualitatively analyzed on the surface were quantified from detection of the XPS photoelectron spectra of the elements obtained. In EPMA, the surface of the sample was irradiated with an electron beam under conditions of an acceleration voltage of 15 kV, a probe current of $5 \times 10^{-8}$, and a probe size of 100 μm, to analyze the spectra of characteristic X-rays generated, thereby conducting qualitative and quantitative analyses of the elements. Further, ZAF correction was applied to C using a calculated intensity.

(Film Thickness)

The film thickness was measured by introducing a masked Si wafer together with a base into a film forming apparatus, removing the mask after film formation, and measuring the step between the masked portion and the non-masked portion. The film thickness described in Examples is a film thickness controlled to have a prescribed film thickness by the time from the film forming rate that has been determined by forming a single layer film beforehand under each film forming condition.

(Film Hardness)

The film hardness was measured using a micro indentation hardness tester (H100, manufactured by Helmut FISCHER GmbH). A Vickers indenter was used as a probe, and a load of 5 mN was applied and maintained for 10 seconds, followed by unloading, to calculate the film hardness from the depth of the inserted Vickers indenter.

(Color Tone)

The color tone (brightness and saturation) was measured using SpectraMagic NX, manufactured by KONICA MINOLTA, INC. Specifically, using a light source D65, L*, a*, and b* based on the L*a*b* chromaticity diagram and h in the L*C*h color system were measured.

The film hardness and the color tone of the decorative member were evaluated by performing the aforementioned measurements on the decorative member in which all layers constituting the member were layered on the base. Further, the film hardness and the color tone of the adhesion layer, the hardening layer, the undercoat layer, the adjustment layer, and the finishing layer were evaluated by performing the aforementioned measurements on the sample in which only the adhesion layer, the hardening layer, the undercoat layer, the adjustment layer, or the finishing layer is layered on the base (for example, Ti material) under the same conditions as in Examples above.

(Scratch Resistance Test)

The scratch resistance test was performed as follows. First, a decorative membrane was applied to a SUS316L base defined in JIS, and abrasion paper in which alumina particles were uniformly dispersed was brought into contact with the test sample with a constant weight, followed by rubbing a certain number of times, to generate scratches. The surface roughness of the test sample with the scratches was measured by scanning the surface in the scratch direction and the perpendicular direction, to evaluate the scratch resistance from the root mean square roughness. The larger the number of scratches generated, and the deeper the scratches, the numerical value of the root mean square roughness increases. Conversely, the smaller the number of scratches generated, and the shallower the scratches, the numerical value of the root mean square roughness decreases. Therefore, the scratch resistance can be numerically evaluated.

(Surface Analysis Using Atomic Force Microscope)

Using an SPM3800N, manufactured by Seiko Instruments Inc., as the atomic force microscope and SI-DF20 as a micro cantilever, a 3-μm region was measured in the DFM mode.

(X-Ray Diffraction Measurement)

The X-ray diffraction was measured, using a SmartLab, manufactured by Rigaku Corporation, by the Out-Of-Plane method (thin film method) at an incidence angle of 1°, a step of 0.02°, and a speed of 3 sec/step, in a measurement range of 0 to 120 degrees.

REFERENCE SIGNS LIST

10: Decorative member
11: Base
12: Undercoat layer
13: Finishing layer
20: Decorative member
21: Base
22: Undercoat layer
23: Finishing layer
30: Decorative member
31: Base
32: Undercoat layer
33: Finishing layer
40: Decorative member
41: Base
42: Undercoat layer
43: Adjustment layer
44: Finishing layer
50: Decorative member
51: Base
52: Hardening layer
53: Undercoat layer
54: Adjustment layer
55: Finishing layer
60: Decorative member
61: Base
62: Adhesion layer
63: Hardening layer
64: Undercoat layer
65: Adjustment layer
66: Finishing layer
70: Decorative member
71: Base
72: Adhesion layer
73: Hardening layer
74: Undercoat layer
75: Adjustment layer
76: Finishing layer
80: Decorative member
81: Base
82: Adhesion layer
83: Gradient layer
84: Hardening layer
85: Undercoat layer
86: Adjustment layer
87: Finishing layer
90: Decorative member
91: Base
92: Adhesion layer
93: Gradient layer
94: Hardening layer
95: Undercoat gradient layer
96: Undercoat layer
97: Adjustment layer
98: Finishing layer

The invention claimed is:

1. A decorative member comprising a base and a decorative coating formed on the base, wherein
the decorative coating is formed by layering an undercoat layer and a finishing layer from the base side,
the undercoat layer is a carbonitride layer composed of a carbonitride of a metal containing Ti and at least one selected from Nb and Ta,
the undercoat layer contains 22 to 66 mass % in total of the at least one selected from Nb and Ta, 20 to 50 mass % of Ti, 7 to 19 mass % of nitrogen, and 4 to 15 mass % of carbon, assuming that the total amount of nitrogen, carbon, and the metal composed of Ti and the at least one selected from Nb and Ta is 100 mass %, and
the finishing layer is an Au alloy layer composed of an alloy containing Au, a metal having a silver color, and Cu.

2. The decorative member according to claim 1, wherein the decorative coating further comprises an adjustment layer and is formed by layering the undercoat layer, the adjustment layer, and the finishing layer from the base side, and
the adjustment layer has a layer structure in which a Au alloy layer composed of an alloy containing Au, Pd, and Cu, and a carbonitride layer composed of a carbonitride of a metal containing Ti and at least one selected from Nb and Ta are alternately layered.

3. The decorative member according to claim 2, wherein the adjustment layer has a layer structure in which a unit of one Au alloy layer and one carbonitride layer is repeated once or twice.

4. The decorative member according to claim 1, wherein the decorative coating further comprises a hardening layer and is formed by layering the hardening layer, the undercoat layer, and the finishing layer from the base side, and
the hardening layer is a nitride layer composed of a nitride of a metal containing Ti and at least one selected from Nb and Ta.

5. The decorative member according to claim 4, wherein the decorative coating further comprises an adhesion layer and is formed by layering the adhesion layer, the hardening layer, the undercoat layer, and the finishing layer from the base side, and the adhesion layer is a Ti alloy layer composed of a metal containing Ti and at least one selected from Nb and Ta.

6. The decorative member according to claim 4, wherein
the decorative coating further comprises an adhesion layer and is formed by layering the adhesion layer, the hardening layer, the undercoat layer, and the finishing layer from the base side, and
the adhesion layer is a Ti layer composed of Ti and optionally containing oxygen.

7. The decorative member according to claim 5, wherein
the decorative coating further comprises a gradient layer and is formed by layering the adhesion layer, the gradient layer, the hardening layer, the undercoat layer, and the finishing layer from the base side,
the gradient layer is a nitride layer composed of a nitride of a metal containing Ti and at least one selected from Nb and Ta, and the amount of nitrogen in the nitride increases as the distance from the base increases in the thickness direction of the decorative coating.

8. The decorative member according to claim 7, wherein
the decorative coating further comprises an undercoat gradient layer and is formed by layering the adhesion layer, the gradient layer, the hardening layer, the undercoat gradient layer, the undercoat layer, and the finishing layer from the base side,
the undercoat gradient layer is a carbonitride layer composed of a carbonitride of a metal containing Ti and at least one selected from Nb and Ta,
the amount of nitrogen in the carbonitride decreases as the distance from the base increases in the thickness direction of the decorative coating, and the amount of carbon in the carbonitride increases as the distance from the base increases in the thickness direction of the decorative coating.

9. The decorative member according to claim 1, wherein
the finishing layer is a Au alloy layer composed of an alloy containing Au, Pd, and Cu, and
62 to 90 mass % of Au, 2.5 to 17 mass % of Pd, and 5 to 21 mass % of Cu are contained in the finishing layer, assuming that the total amount of Au, Pd, and Cu is 100 mass %.

10. The decorative member according to claim 2, wherein
62 to 90 mass % of Au, 2.5 to 17 mass % of Pd, and 5 to 21 mass % of Cu are contained in the Au alloy layer of the adjustment layer, assuming that the total amount of Au, Pd, and Cu is 100 mass %.

11. The-decorative member according to claim 2, wherein
22 to 66 mass % in total of the at least one selected from Nb and Ta, 20 to 50 mass % of Ti, 7 to 19 mass % of nitrogen, and 4 to 15 mass % of carbon are contained in the carbonitride layer of the adjustment layer, assuming that the total amount of nitrogen, carbon, and the metal composed of Ti and the at least one selected from Nb and Ta is 100 mass %.

12. The decorative member according to claim 5, wherein
25 to 75 mass % in total of the at least one selected from Nb and Ta and 25 to 75 mass % of Ti are contained in the adhesion layer, assuming that the total amount of Ti and the at least one selected from Nb and Ta is 100 mass %.

13. The decorative member according to claim 1, wherein
the decorative coating has a thickness of 0.3 to 3.0 μm.

14. The decorative member according to claim 1, wherein
in the finishing layer, L* is 80 or more, a* is 4 to 10, and b* is 9.5 to 16 in the L*a*b* color system, and
h is 55° to 67° in the L*C*h color system.

15. The decorative member according to claim 1, wherein
the metal having a silver color is at least one selected from Pd, Pt, and Rh.

16. The decorative member according to claim 1, wherein
the finishing layer is a Au alloy layer composed of an alloy containing Au, Pd, and Cu.

17. The-decorative member according to claim 1, wherein
a peak corresponding to the plane and/or the plane is observed in a diffraction pattern obtained by the X-ray diffraction measurement of the finishing layer.

18. A method for producing a decorative member according to claim 1,
the method comprising:
an undercoat layer layering step of layering the undercoat layer on the base; and
a finishing layer layering step of layering the finishing layer on the base on which the undercoat layer has been layered.

19. The method for producing a decorative member according to claim 18, wherein
the metal having a silver color is at least one selected from Pd, Pt, and Rh.

20. The method for producing a decorative member according to claim 18, wherein
the finishing layer is a Au alloy layer composed of an alloy containing Au, Pd, and Cu.

21. The method for producing a decorative member according to claim 18, further comprising
a step of subjecting the decorative member to annealing treatment.

22. The method for producing a decorative member according to claim 21, wherein
the annealing treatment temperature is 200 to 500° C.

* * * * *